US009520562B2

(12) United States Patent
Xie et al.

(10) Patent No.: US 9,520,562 B2
(45) Date of Patent: Dec. 13, 2016

(54) METHOD OF MAKING A RESISTIVE RANDOM ACCESS MEMORY

(71) Applicant: ASM IP Holding B.V., Almere (NL)

(72) Inventors: Qi Xie, Leuven (BE); Jan Willem Maes, Wilrijk (BE); Tom Blomberg, Vantaa (FI); Marko Tuominen, Helsinki (FI); Suvi Haukka, Helsinki (FI); Robin Roelofs, Leuven (BE); Jacob Woodruff, Scottsdale, AZ (US)

(73) Assignee: ASM IP Holding B.V. (NL)

( * ) Notice: Subject to any disclaimer, the term of this patent is extended or adjusted under 35 U.S.C. 154(b) by 8 days.

(21) Appl. No.: 14/334,536

(22) Filed: Jul. 17, 2014

(65) Prior Publication Data

US 2015/0021537 A1    Jan. 22, 2015

Related U.S. Application Data

(60) Provisional application No. 61/856,605, filed on Jul. 19, 2013, provisional application No. 61/975,591, filed on Apr. 4, 2014.

(51) Int. Cl.
*H01L 45/00* (2006.01)
*H01L 21/02* (2006.01)
*H01L 27/24* (2006.01)

(52) U.S. Cl.
CPC ....... *H01L 45/1616* (2013.01); *H01L 21/0228* (2013.01); *H01L 21/02175* (2013.01); *H01L 27/249* (2013.01); *H01L 45/08* (2013.01); *H01L 45/085* (2013.01); *H01L 45/12* (2013.01); *H01L 45/1226* (2013.01); *H01L 45/1266* (2013.01);

(Continued)

(58) Field of Classification Search
CPC ................... H01L 21/02109; H01L 21/02172; H01L 21/02225; H01L 21/0226
See application file for complete search history.

(56) References Cited

U.S. PATENT DOCUMENTS 6,825,135 B2    11/2004   Li et al.
6,849,868 B2     2/2005   Campbell
6,855,975 B2     2/2005   Gilton
(Continued)

OTHER PUBLICATIONS

Ahn et al., "Concurrent presence of unipolar and bipolar resistive switching phenomena in pnictogen oxide $Sb_2O_5$ films," *Journal of Applied Physics*, vol. 112, 114105, 5 pps (2012).

(Continued)

*Primary Examiner* — Cheung Lee
(74) *Attorney, Agent, or Firm* — Knobbe, Martens, Olson & Bear LLP

(57) ABSTRACT

The disclosed technology generally relates to semiconductor devices, and relates more particularly to resistive random access memory devices and methods of making the same. In one aspect, a method of forming a resistive random access memory cell of a random access memory device includes forming a first electrode and forming a resistive switching material comprising an oxide of a pnictogen element by atomic layer deposition. The method additionally includes forming a metallic layer comprising the pnictogen element by atomic layer deposition (ALD). The resistive switching material is interposed between the first electrode and the metallic layer.

56 Claims, 9 Drawing Sheets

(52) U.S. Cl.
CPC ............. *H01L 45/14* (2013.01); *H01L 45/146* (2013.01); *H01L 45/1608* (2013.01)

(56) References Cited

U.S. PATENT DOCUMENTS

| | | | |
|---|---|---|---|
| 6,858,482 | B2 | 2/2005 | Gilton |
| 6,864,500 | B2 | 3/2005 | Gilton |
| 6,867,114 | B2 | 3/2005 | Moore et al. |
| 6,890,790 | B2 | 5/2005 | Li et al. |
| 7,183,207 | B2 | 2/2007 | Kang et al. |
| 8,007,865 | B2 | 8/2011 | Delabie et al. |
| 2008/0116437 | A1* | 5/2008 | Oh .......................... H01L 45/06 257/2 |
| 2010/0243983 | A1 | 9/2010 | Chiang et al. |
| 2012/0028410 | A1* | 2/2012 | Marsh ................... C23C 16/305 438/102 |
| 2012/0074376 | A1* | 3/2012 | Kumar ............... G11C 13/0007 257/4 |
| 2012/0127779 | A1 | 5/2012 | Scheuerlein et al. |
| 2012/0248396 | A1 | 10/2012 | Ramaswamy et al. |
| 2012/0305878 | A1* | 12/2012 | Miller ................... H01L 45/085 257/4 |
| 2013/0328005 | A1 | 12/2013 | Shin et al. |
| 2014/0124725 | A1* | 5/2014 | Chi ......................... H01L 45/08 257/4 |

OTHER PUBLICATIONS

Ahn et al., "Unipolar resistive switching characteristics of pnictogen oxide films: Case study of $Sb_2O_5$," *Journal of Applied Physics*, vol. 112, 104105, 10 pps. (2012).

Baek et al, "Realization of Vertical Resistive Memory (VRRAM) using cost effective 3D Process," *IEEE*, 978-1-4577-0505-2/11, pp. 31.8.1-31.8.4 (2011).

Chen et al, "Fully CMOS BEOL compatible $HfO_2$ RRAM cell, with low (μA) program current, strong retention and high scalability, using an optimized Plasma Enhanced Atomic Layer Deposition (PEALD) process for TiN electrode," *IEEE*, 978-1-4577-0502-1/11, 3 pps. (2011).

Chen et al., "Hydrogen-Induced Resistive Switching in TiN/ALD $HfO_2$/PEALD TiN RRAM Device," *IEEE Electron Device Letters*, vol. 33, No. 4, pp. 483-485 (Apr. 2012).

Govoreanu et al., "10x10$nm^2$ Hf/$HfO_x$ Crossbar Resistive RAM with Excellent Performance, Reliability and Low-Energy Operation," *IEEE*, 978-1-4577-0505-2/11, pp. 31.6.1-31.6.4 (2011).

Lee et al, "Multi-level Switching of Triple-layered TaOx RRAM with Excellent Reliability for Storage Class Memory," *IEEE Symposium on VLSI Technology Digest of Technical Papers*, 978-1-4673-08472/12, pp. 71-72 (2012).

Peng et al., "Improvement of Resistive Switching Stability of $HfO_2$ Films with Al Doping by Atomic Layer Deposition," *Electrochemical and Solid-State Letters*, vol. 15 (4), pp. H88-H90 (2012).

* cited by examiner

METHOD OF MAKING A RESISTIVE RANDOM ACCESS MEMORY

CROSS REFERENCE TO RELATED APPLICATIONS

This application claims priority under 35 U.S.C. §119(e) to U.S. provisional patent application 61/856,605, filed on Jul. 19, 2013, and to U.S. provisional patent application 61/975,591, filed on Apr. 4, 2014, the contents of which are incorporated herein by reference in their entireties.

BACKGROUND

1. Field

The invention relates to the field of semiconductor processing and more particularly resistive random access memory and methods for manufacturing such memory.

2. Description of the Related Art

Nonvolatile memory devices are used in a variety of electronic devices such as mobile phones, smartphones, digital cameras, digital music players, tablet computers, and lap top computers, to name a few. As nonvolatile memory devices continue to shrink in size to meet an increasing need for higher device density, there is a correspondingly growing need for three dimensional arrays of memory devices as well as new memory devices that store information based on resistance change.

SUMMARY

In one aspect, a method of forming a resistive random access memory device comprises forming a resistive random access memory cell. Forming the resistive random access memory cell includes providing a first electrode and forming a resistive switching material comprising an oxide of a pnictogen element by atomic layer deposition. The method additionally includes forming a metallic layer comprising the pnictogen element by atomic layer deposition (ALD). The resistive switching material is interposed between the first electrode and the metallic layer.

In another aspect, a method of forming a resistive random access memory cell includes forming a first electrode, forming a barrier layer comprising a first metal oxide over the first electrode, and forming a resistive switching material over the barrier layer by atomic layer deposition. The method additionally includes forming a metallic layer over the resistive switching material by atomic layer deposition. The barrier layer and the resistive switching material are interposed between the first electrode and the metallic layer.

In another aspect, a resistive random access memory device includes a memory cell. The memory cell includes a first electrode comprising TiN, a metallic layer comprising a pnictogen element, and a resistive switching material comprising an oxide of a pnictogen element, where the resistive switching material is interposed between the first electrode and the metallic layer.

In another aspect, a method of forming a random access memory cell includes providing a first electrode and forming by atomic layer deposition a resistive switching material comprising a nanolaminate layer comprising a plurality of alternating elemental pnictogen layers and pnictogen oxide layers. The method additionally includes providing a second electrode, wherein the resistive switching material is interposed between the first electrode and the second electrode.

In another aspect, a method of fabricating a resistive random access memory cell comprises providing a substrate and a first electrode on the substrate and forming via atomic layer deposition a resistive switching material over the first electrode, wherein the resistive switching material comprises an oxide. The method additionally includes depositing via atomic layer deposition a metallic layer on the resistive switching material, wherein the metallic layer comprises a metal and a pnictogen chosen from the group consisting of As, Bi, Sb, and P.

In another aspect, a method of fabricating a resistive random access memory cell comprises providing a substrate, providing a first electrode on the substrate, and forming via atomic layer deposition a resistive switching material over the first electrode, wherein the resistive switching material comprises a non-pnictogen oxide. The method further includes doping the oxide with a metallic material comprising a metal and a pnictogen chosen from the group consisting of As, Bi, Sb, and P.

In another aspect, a method of fabricating a resistive random access memory cell comprises providing a substrate, providing a first electrode on the substrate, and depositing via atomic layer deposition a metallic layer over the first electrode, wherein the metallic layer comprises a pnictogen chosen from the group consisting of As, Bi, Sb, and P. The method further includes forming via oxidation of the metallic layer a resistive switching material over the first electrode.

DETAILED DESCRIPTION

Figure 1:
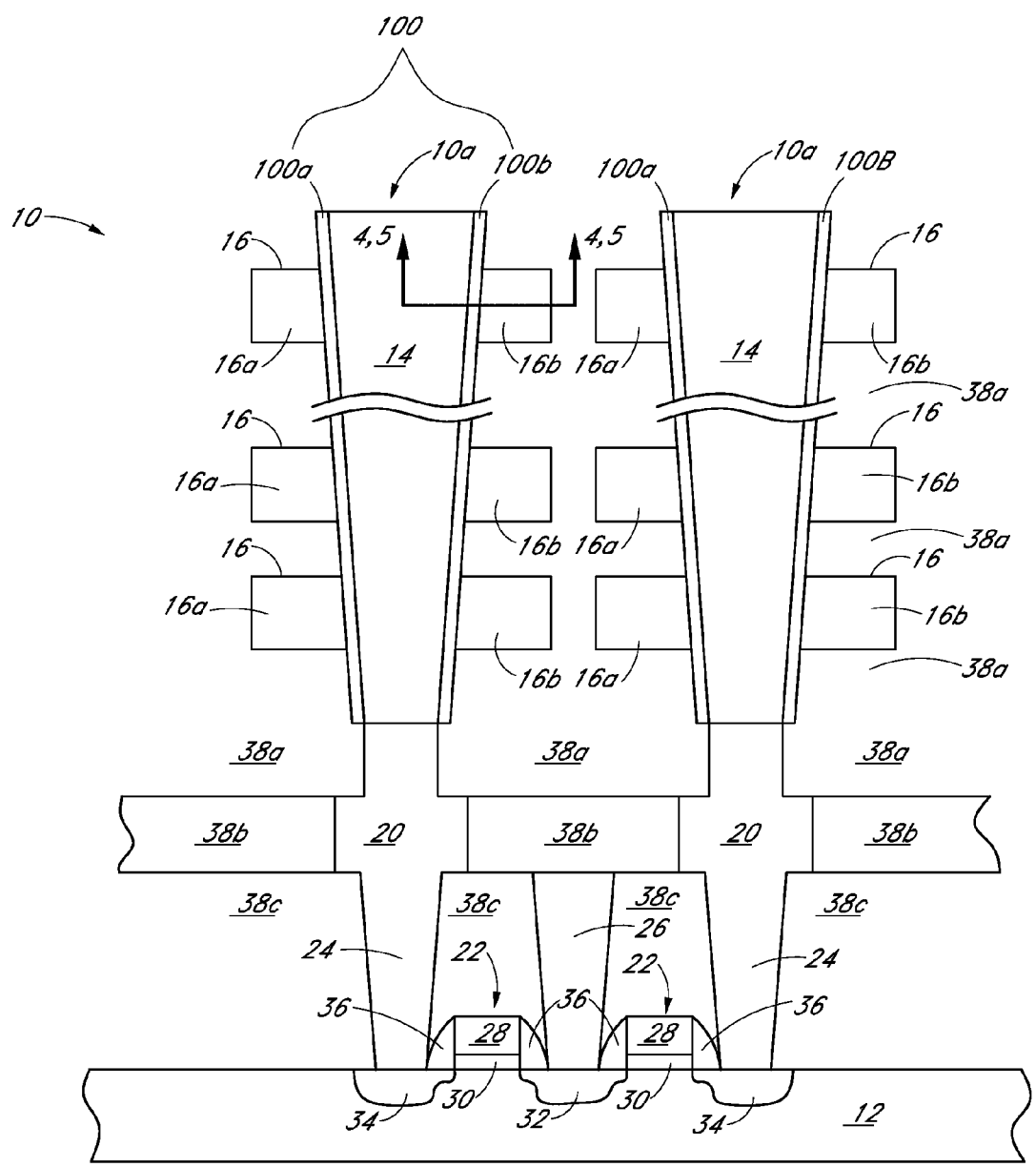
FIG. 1 is a schematic cross-sectional illustration of a 3D RRAM array according to some embodiments.

Electronic devices such as smartphones, computers, and digital cameras store large amounts of data in nonvolatile storage devices such as hard disks or solid state drives. In many mobile applications such as smart phones and mobile computers, solid state drives are often preferred over hard disks because of their compact size as well as relative immunity from reliability issues arising from motion. Solid state drives may comprise, among other things, billions of dual-gate transistors called flash transistors that store charge in floating gates. The flash transistors can be arranged in various forms of array architectures. One particular array architecture known as the NAND array architecture employs flash transistors arranged in strings of 16, 32, 64, or 128 flash transistors whose channels are controlled by word lines that form control gates of the flash transistors. A NAND block can include a plurality of such strings, such as 1024, 2048, etc., where each string is connected to a bit line through a select transistor. NAND array configurations provide one of the highest numbers of flash transistors per unit area, making them particularly suitable for storing a high density of digital media.

The demand for higher and higher density (and also lower and lower cost) of flash transistors has resulted in continued reduction in size of the flash transistors. As the flash transistors scale below about the 20 nm node, the reliability of the flash transistors can degrade substantially, due to parasitic capacitive coupling between neighboring floating gates and reduction in number of stored electrons per floating gate, among other things. Several scalability concepts are under investigation to allow the density of storage devices to continue to follow the trend of decreasing size and increasing density.

The first scalability concept addresses scalability at the memory cell-level and employs storage devices based on a resistance change of a memory cell, as opposed to changes in the threshold voltage of a flash transistor. Various storage devices based on resistance change have been proposed as alternatives to flash transistors for continued scaling, including resistive-switching random access memory (RRAM). An RRAM device can include a resistance switching layer between two electrodes. The resistance of the switching layer can be switched between a high resistance state (HRS) and a low resistance state (LRS) by application of an electrical signal.

The second scalability concept addresses scalability at the array-level and employs three-dimensional (3D) arrays. For example, in some architectures, "strings" of 16, 32, 64, 128, etc. RRAM devices, or cells, may extend vertically in a direction perpendicular to the surface of the silicon substrate. In one example of a 3D RRAM array, a first set of interconnects, e.g., word lines, extend vertically in a direction perpendicular to the surface of a silicon substrate and a second set of interconnects, e.g., bit lines, extend horizontally in a direction parallel to the surface of the substrate and are configured to form cross junctions with the word lines. A resistive switching stack is disposed between the word lines and the bit lines at the cross junctions to form RRAM cells such that when an electrical signal is applied across them, the RRAM cells can reversibly switch between LRS and HRS.

A three-dimensional resistive random access memory (3D RRAM) array according to some embodiments includes a plurality of sub-arrays disposed adjacent to one another in a x-direction. Each sub-array may include a plurality of first electrode lines stacked vertically in a z-direction and extending horizontally in a y-direction. Each sub-array may further include a plurality of second electrode lines extending vertically in the z-direction. Each of the second electrode lines may traverse at least one first electrode line and form at least one cross-point junction with one of the first electrode lines. At each of the cross-junctions, first and second electrode lines may be interposed by a resistive switching stack to form an RRAM cell.

The third scalability concept addresses scalability at the array-level and employs an RRAM cell having a non-linear current-voltage (I-V) relationship. A non-linear current-voltage I-V can be advantageous, for example, in avoiding false read-outs due to leakage currents arising from neighboring cells. Furthermore, non-linear behavior can also be advantageous in reducing leakage current from memory cells that are inhibited during an access operation (e.g., write or read). A reduction in leakage current from inhibited memory cells during an access operation in turn can provide an overall reduction of power and/or energy of the access operation per memory cells, which in turn can allow a larger number of memory cells within the array.

Fabrication of 3D RRAM arrays poses unique process integration challenges. For example, in some cases, the 3D RRAM arrays may be fabricated as part of "backend" processing steps, after supporting CMOS circuitry such as drivers and charge pumps have been fabricated in the "frontend" processing steps. Such process architecture allows for a reduction of the overall footprint of the memory array and for achieving higher array efficiency. In addition, under certain circumstances, array fabrication can occur subsequent to fabrication of one or more metallization levels. For these reasons, one set of challenges arises from temperature constraints of processes used to fabricate the 3D RRAM arrays. For example, it has been found that 3D RRAM array processing temperatures of about 450° C. or less are desirable to prevent damage or other detrimental alterations to earlier formed structures. In addition, because the "strings" can extend vertically over relatively long lengths, deposition or etch of certain materials sometime occur over features having high aspect ratios. Furthermore, RRAM cells may be designed using materials that may not be "traditional" CMOS-compatible materials (e.g., noble metals such as Pt, Au, etc.) that can pose integration challenges (e.g., etch challenges).

Many processes may not be compatible with one or more of these scalability concepts. For example, because thermal atomic layer (ALD) deposition processes rely on thermal energy for reaction of the precursors on substrate surfaces, some ALD processes require temperatures greater than the maximum temperature for reliable fabrication as described above. On the other hand, plasma-enhanced deposition processes such as plasma-enhanced atomic layer deposition (PE-ALD) can be implemented at sufficiently low temperatures. However, film thickness can impact the functionality of memory cells and PE-ALD may not offer the conformality of deposition of different films such as electrode films and resistive switching materials that is sufficient for certain vias and cavities having high aspect ratios, particularly for vertically extending strings of cells in 3D arrays. Due to the need for a sheath in some cases, plasma processes may not be effective in depositing inside these types of topographies. Furthermore, while certain resistive switching materials can be deposited with sufficient conformality at sufficiently low temperatures, they can require nontraditional CMOS materials, such as noble metal electrodes to operate. Accordingly, there is a need for a resistive switching material stack and methods of fabrication that can be formed at low temperatures with high conformality, and without the need for nontraditional materials such as noble metals. In some embodiments, memory stacks and methods are disclosed that can advantageously meet these criteria, as well as methods of forming such stacks using thermal atomic layer deposition techniques.

Reference will now be made to the Figures, in which like numerals refer to like features throughout.

FIG. 1 illustrates a cross-sectional view of a 3D-RRAM array 10 according to some embodiments. The 3D-RRAM array 10 includes a plurality of sub-arrays 10a formed on a semiconductor substrate 12. The number of sub-arrays within a 3D-RRAM array 10 may be any suitable number according to the particular array architecture and fabrication methods employed. However, for simplicity of illustration, only two such sub-arrays 10a are illustrated in FIG. 1. Each sub-array 10a has at least one other adjacent sub-array in the x-direction. In the illustrated embodiment in FIG. 1, the two sub-arrays 10a are adjacent to and face one another in the x-direction.

Each of the sub-arrays 10a includes a plurality of first electrode lines 16 that are stacked in the z-direction and extending in and out of the page in the y direction. For simplicity of illustration, cross-sections of only three first electrode lines 16 for a given sub-array 10a are illustrated in FIG. 1. However, the number of stacked first electrode lines 16 in a given sub-array may be any suitable number N according to the particular array architecture and fabrication methods employed. In addition, adjacently stacked first electrode lines 16 may be separated by an interposing inter-layer dielectric 38a. Thus, in FIG. 1, a stack of first electrodes for a given sub-array includes N stacked first electrode lines 16 and (N-1) interposing inter-layer dielectric layers 38a. According to various implementations, N, the number of stacked first electrode lines 16, can be, for example, 8, 16, 32, 64, 128, 256, etc., depending on the particular array architecture and fabrication methods employed. The first electrode lines 16 may sometimes be referred to as local bit lines, bit lines, or columns.

Each of the sub-arrays 10a further includes a plurality of second electrode lines 14 extending vertically in the z-direction. In some implementations, the second electrode lines 14 form vertical pillars. For simplicity of illustration, a cross-section of only one second electrode line 14 per sub-array 10a is illustrated in FIG. 1. However, the number of second electrode lines 14 in a given sub-array may be any suitable number M according to the particular array architecture employed. In the configuration of FIG. 1, there may be additional electrode lines 14 (not illustrated) in front of and behind the electrode line whose cross-sectional view is illustrated in FIG. 1, in the y-direction in and out of the paper. According to some implementations, each of the sub-arrays 10a can include, for example, N second electrode lines, where N equals 256, 512, 1024, 2048, 4096, etc., depending on the particular array architecture. The second electrode lines 14 may sometimes be referred to as word lines, local word lines, or rows.

In one example configuration, hereinafter referred to as a "wrapped word line architecture," the second electrode line 14 extends through a vertical via extending through the stack of first electrodes lines 16 and inter-layer dielectrics 38a. In some embodiments, the first electrode lines 16 form elongated slabs extending in the y-direction and traverse at least a subset of M second electrode lines 14 in the y-direction. In this configuration, the sidewalls of the vertical vias are lined with a resistive switching stack 100, different parts of which are indicated by 100a and 100b. In addition, the second electrode lines 14 fill the vertical vias lined with the resistive switching stack 100 to form rods, which, in some embodiments, may be cylindrical, extending through the vias that extend through the entire stack of first electrode lines 16 and interposing inter-layer dielectrics 38a. One RRAM cell is formed at each intersection between a first electrode line 16 and a second electrode 14 line, interposed by a resistive switching stack 100 surrounding the second electrode line 14. When a cell is selected by applying an appropriate voltage between a selected first electrode line 16 and a second electrode line 14, a conductive path can form anywhere across the resistive switching stack 100 surrounding the second electrode line 14. Thus, in the wrapped word line architecture, the RRAM cell comprises a second electrode line 14 extending in the z-direction, a resistive switching stack 100 continuously surrounding the second electrode line 14, and the first electrode line 16 surrounding the resistive switching stack 100 surrounding the second electrode line 14. In some embodiments, the second electrode line 14 may take the form of a cylindrical rod. As used herein, "cylindrical" and "rod" structures may have substantially constant widths over their heights or, as illustrated, may have widths that vary, e.g. increase, with height. Cross-sections taken transverse to the height may be substantially circular in some embodiments.

Still referring to FIG. 1, in another example configuration, hereinafter referred to as "intersecting word line architecture," the second electrode line 14 extends through a vertical via extending in the z-direction as in the wrapped word line architecture discussed above. Similar to the wrapped word line architecture, the second electrode line 14 of the intersecting word line architecture extends through a stack of first electrode lines 16a/16b and inter-layer dielectrics 38a interposed between two adjacently stacked first electrode lines 16a/16b. Also similar to the wrapped word line architecture, the sidewalls of the vertical vias, which may be cylindrical, are lined with resistive switching stack 100. In addition, the second electrode lines 14 fill the vertical vias lined with the resistive switching stack 18 to form rods, which may be cylindrical, extending through the vias.

Unlike the wrapped word line architecture, however, the first electrode lines 16a and 16b do not form slabs having holes through which cylindrical second electrodes 14 extend. Instead, a pair of first electrode lines 16a and 16b extend in the y direction and intersect portions of first and second sides of the second electrode lines 14. Disposed at each intersection between the first electrode lines 16a and 16b are first and second resistive switching stacks 100a and 100b, respectively. That is, each of the pair of first electrodes 16a and 16b form elongated lines extending in the y-direction and "share" one second electrode 14. Unlike the wrapped word line architecture, therefore, a conductive path can form across each of the first and second resistive switching stacks 100a and 100b, between the second electrode line 14 and one of the selected first electrode lines 16a or 16b. As a result, unlike the wrapped word line architecture, two conductive paths for the same RRAM cell foot print can be formed. Thus, in this configuration, the RRAM cell comprises a second electrode line 14 forming a cylindrical rod extending in the z-direction, a pair of first electrode lines 16a and 16b extending in the y direction and forming a pair of intersections with the second electrode line 14, and first and second resistive switching stacks 100a and 100b interposed between first electrode lines 16a and 16b and the second electrode line 14 at the pair of intersections. It will be appreciated that the stacks 100a and 100b may be different parts of a continuous stack 100.

The 3D RRAM array of FIG. 1 may further comprise one or more transistors 22 connected to the second electrode lines 14. Each of the transistors 22 is formed in the semiconductor substrate 12 and comprises a gate 28, a source 32, a drain 34, and is connected to the second electrode line 14 through a vertical connector 20. Interlayer dielectrics 38b and 38c electrically insulate various conducting structures. In one embodiment, the transistor 22 can provide a selecting function for a second electrode line 14 and can supply the requisite current through suitable biasing of the gate 28 through a gate contact (not shown) and the source 32 through a source contact 26. In some embodiments, the transistors 22 are configured to supply a drive current sufficient to program and erase at least one RRAM cell.

While the sub-arrays 10a are disposed over and overlapping the transistors 22 when viewed the z-direction in the illustrated embodiment of FIG. 1, other embodiments are possible. In some embodiments, the sub-arrays 10a are disposed over but not overlapping the transistors 22 when viewed in the z-direction. In other embodiments, the transistors 22 are disposed over and overlapping the sub-arrays 10a when viewed in the z-direction. In some other embodiments, the transistors 22 and the sub-arrays 10a are disposed adjacent to each other in the x-direction.

Forming the transistors 22 at different points in the overall fabrication process flow may result in different processing considerations. For example, in the illustrated example of FIG. 1, one consideration arising from the transistors 22 and the associated electrical connections such as vertical connectors 20 being fabricated prior to fabricating the sub-arrays 10a can be a temperature constraint. In some embodiments, high temperature processes subsequent to fabrication of the transistors 22 can lead to undesirable post-fabrication shifts in device parameters such as the threshold voltage, the sub-threshold swing, the punch-thru voltage, among others. In addition, in processes where portions of the vertical connectors include low-temperature melting metals such as Cu or Al, subsequent process temperatures are limited to temperatures where such effects do not pose a significant concern. Thus, it may be desirable to limit the temperature of various processes. In some embodiments, fabrication temperatures for sub-arrays 10a may be lower than about 400° C. In other embodiments, the fabrication temperatures for sub-arrays 10a may be lower than about 350° C. In yet other embodiments, the fabrication temperatures for sub-arrays 10a may be lower than about 300° C.

In addition, as discussed above, various process integration approaches of such 3D RRAM arrays may require conformal deposition of a resistive switching stack and at least one of the first or second electrode lines on surfaces of vias and cavities having high aspect ratios. While plasma-enhanced processes such as PE-ALD may be effective in lowering deposition temperatures for deposition on some exposed surfaces, such processes may not be effective in depositing inside vias and cavities having the high aspect ratios. Advantageously, thermal atomic layer depositions according to embodiments disclosed herein can effectively deposit into high aspect ratio features, for forming various films of the 3D RRAM arrays.

Additionally, in embodiments where the transistors 22 and the associated electrical connections are fabricated prior to fabricating the sub-arrays 10a, usage of plasma processes may pose additional concerns. During a plasma process, certain conducting structures of partially fabricated integrated circuit devices may accumulate charge from the plasma. The accumulated charge can lead to a discharging event during processing, leading to high levels of current flowing through various current paths, for example, through diodes, gate dielectrics of transistors, and RRAM devices. Such discharging events can lead to performance and reliability degradation of the integrated circuit devices, including RRAM devices. For example, a discharging event can lead to a degradation of resistive switching stack. Thus, for these reasons, it may be desirable to use thermally activated processes in lieu of plasma processes and not exceed the backend processing temperature regimes discussed above.

The 3D RRAM array 10 of FIG. 1 can be fabricated in any number of ways. In FIG. 1, starting from the semiconductor substrate 12, structures up to and including the vertical connectors 20 can be fabricated using silicon fabrication processes well known to a person having ordinary skilled in the art. Prior to forming the sub-arrays 10a, a planar surface exposing vertical connectors 20 and inter-layer dielectric layer 38b is provided using various fabrication processes, such as a subtractive metal flow or a dual-damascene flow. In the following, fabrication processes for sub-arrays 10a will be discussed in detail.

Subsequent to formation of vertical connectors 20, in some embodiments, hereinafter referred to as relating to a "bitline-first flow," a stack comprising N layers of interlayer dielectric 38a and N first electrode layers are alternatingly deposited.

The first electrode layer comprises any suitable conductive and semiconductive materials including n-doped poly silicon and p-doped poly silicon, metals including C, Al, Cu, Ni, Cr, Co, Ru, Rh, Pd, Ag, Pt, Au, Jr, Ta, Ti, Hf, Zr, Nb and W, conductive metal nitrides, conductive metal silicides including tantalum silicides, tungsten silicides, nickel silicides, cobalt silicides, and titanium silicides, and conductive metal oxides including $RuO_2$. In some embodiments, the second electrode material includes a transition metal and may be, for example, a transition metal nitride, such as TiN, TaN, WN, or TaCN. In the bitline-first flow, first electrode layer can be deposited using various processes for depositing a planar film, including chemical vapor deposition (CVD), plasma-enhanced chemical vapor deposition (PE-CVD), plasma-enhanced atomic layer deposition (PE-ALD), and physical vapor deposition (PVD), among others. In some embodiments, the first electrode layer is formed by thermal atomic layer deposition (ALD).

The inter-layer dielectric 38a comprises electrically insulating dielectric material including, for example, $SiO_2$ or $Si_3N_4$, among others. The inter-layer dielectric 38a can be formed using a suitable process for depositing a planar film, such as chemical vapor deposition (CVD), high density chemical vapor deposition (HDP-CVD), and spin-on dielectric processes (SOD), among others.

Subsequently, according to one aspect of the bitline-first flow, vertical vias are formed through the stack comprising N layers alternating interlayer dielectrics 38a and first electrode layers using patterning techniques, e.g., lithography and etch techniques, suitable for forming high aspect-ratio vias. In some embodiments, the vias have a diameter in the range between about 20 nm and about 500 nm, or between about 20 nm to about 100 nm. In addition, in some embodiments, the vias have a depth in the range between about 0.5 μm and about 20 μm, or between about 0.5 μm and about 5 μm. Thus, the aspect ratio of the vias may be about 15 or higher, about 25 or higher, or about 35 or higher.

The sidewalls of the vertical vias may subsequently be lined with a resistive switching stack 100. In some embodiments, the resistive switching stack 100 can include an oxide of a pnictogen, which can include metal oxides that include at least one of As, Bi, Sb, and P. In some embodiments, the resistive switching stack 100 includes antimony oxide. In some other embodiments, the resistive switching stack 100 can include other metal oxide materials, e.g., NiO, $HfO_2$, $ZrO_2$, $Cu_2O$, $TaO_2$, $Ta_2O_5$, $TiO_2$, $SiO_2$, $Al_2O_3$ and/or alloys including two or more metals, e.g., transition metals, alkaline earth metals, and/or rare earth metals. The resistive switching stack 100 can be formed by a thermal atomic layer deposition (ALD), which can be particularly advantageous for forming 3D RRAM memory cells. For example, for vias having relatively high aspect ratios and/or relatively small diameters, ALD-type processes can facilitate the deposition of exceptionally conformal layers. Furthermore, a plasma may not reach deeper portions of high aspect ratio vias under some circumstances. In these circumstances, different portions of vias may be exposed to different amounts of the plasma, leading to undesirable structural effects of non-uniform deposition, such as thicker films being deposited near the opening of the via compared to deeper portions (sometimes called cusping). For these reasons, a thermal ALD may be more advantageous, because thermal ALD does not depend on the ability of the plasma to reach portions of the surface being deposited on.

Subsequently, according to another aspect of the "bitline-first flow," the resistive switching stack 100 formed at the bottom of the vertical vias may be removed by a suitable etch technique in order to make electrical contacts between the transistors 22 and the second electrode lines 14. Subsequently, the vertical vias lined with resistive switching stack 100 are filled with a suitable second electrode material for the second electrode lines 14. Possible second electrode materials include similar materials as first electrode materials. The second electrode material can be deposited using a thermal atomic layer deposition (ALD) in some embodiments. As discussed above in connection with the deposition of resistive switching stack 100, for vias having relatively high aspect ratio and/or relatively small diameters, ALD-type processes can facilitate the deposition of exceptionally conformal layers. In addition, as discussed above for deposition of resistive switching stack, under circumstances where different portions of a via may be exposed to different amounts of the plasma, thermal ALD may provide advantages compared to PE-ALD, so as to avoid undesirable structural effects arising from non-uniform plasma exposure such as higher amounts of the second electrode material being deposited near the opening of the via compared to deeper portions, which can lead to unintended voids within the second electrode lines 14.

Subsequently, according to another aspect of the "bitline-first flow," the sub-arrays 10a may be planarized to remove excess second electrode material. The sub-arrays 10a are then separated, thereby separating the first electrode layer into first electrode lines 16 for each sub-array 10a using suitable lithography and etch techniques for etching through multiple stacks of alternating insulators and conductors. Inter-sub-array gaps formed between the sub-arrays 10a are subsequently filled with inter-layer dielectric 38a and planarized using similar materials and techniques discussed above. Subsequently, additional processes may follow to further connect first electrodes 16 and second electrodes 14 to higher level metal lines.

In some other embodiments, hereinafter referred to as relating to a "bitline-last flow," processes steps prior to forming the sub-arrays 10a are substantially the same as in the bitline-first flow. Subsequently, in contrast to the bitline-first flow, the deposited stack of N layers of interlayer dielectric 38a and N first electrode layers comprise depositing first electrode layers that are sacrificial. Sacrificial first electrode layers may comprise any suitable layer that can be selectively removed later in the process, either by wet etch or dry etch, while not removing the interlayer dielectric 38a nor the resistive switching stack 100. For example, in embodiments where the interlayer dielectric 38a is $SiO_2$, the sacrificial first electrode layers may be $Si_3N_4$ layers or polycrystalline Si layers. Subsequently in the bitline-last flow, the processing steps leading up to and including separating the sub-arrays are substantially similar to bitline-first flow, aside from the fact that materials being etched in forming the vertical vias, for example, include sacrificial first electrode material instead of a permanent first electrode material.

According to one aspect of the bitline-last flow, upon separation of the sub-arrays 10a using suitable lithography and etch techniques, the sacrificial first electrode layers are replaced with permanent first electrode materials to form the first electrode lines 16. The removal of the sacrificial first electrode layer can be performed using wet or dry etch techniques suitable for preferentially removing the sacrificial first electrode material while not removing the interlayer dielectric 38a nor the resistive switching stack 100. For example, in embodiments where the interlayer dielectric 38a is $SiO_2$, the sacrificial first electrode layers are $Si_3N_4$ layers, and the resistive switching stack 100 includes $Sb_2O_5$, a suitable etch process can be a wet-etch that selectively removes $Si_3N_4$ while leaving the $SiO_2$ and the $Sb_2O_5$ intact.

In another aspect of the bitline-last flow, horizontal recessed cavities formed by removal of sacrificial first electrode layers are filled with a suitable permanent first electrode material, which may include substantially the same materials as suitable second electrode materials discussed above in connection with the bitline-first flow. Unlike the bitline-first flow where the first electrode layers can be deposited using various processing techniques for depositing the first electrode layer on a substantially planar surface, some processing techniques may not be suitable for depositing the permanent first electrode material in the bitline-last flow. This is because the permanent first electrode material is deposited on surfaces of horizontal recessed cavities. As a result, processes suitable for depositing permanent first electrode material in the bitline-last flow can include processes similar to those used for depositing the second electrode material into high aspect ratio vias. In some embodiments, the first electrode material is deposited by thermal ALD. It is contemplated that chemical vapor deposition (CVD), plasma-enhanced chemical vapor deposition (PE-CVD), plasma-enhanced atomic layer deposition (PE-ALD) may also be applied to deposit the first electrode material in some circumstances, including where requirements for conformality are more relaxed. As discussed above in connection with deposition of the resistive switching stack 100 and the second electrode material on inner surfaces of vias having relatively high aspect ratio and/or small diameter for bitline-first flow, the second electrode material may be deposited on inner surfaces of horizontal cavities by a thermal ALD process. In addition, as discussed above for the bitline-first flow, because different portions of horizontal cavities may be exposed to different amounts of a plasma, thermal ALD may provide advantages compared to PE-ALD, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap.

Subsequently in another aspect of the bitline-last flow, separated first electrode lines 16 are formed by removing first electrode materials from the sidewall surfaces of the inter-layer dielectric 38a between the first electrode lines 16. Subsequent processes for filling the inter-sub-array gaps between the sub-arrays 10a with inter-layer dielectric 38a and planarizing may be substantially similar as discussed above for bit-line first flow. Also similar to bit-line first flow, additional processes may follow to further connect first electrodes 16 and second electrodes 14 to higher level metal lines.

Figure 2:
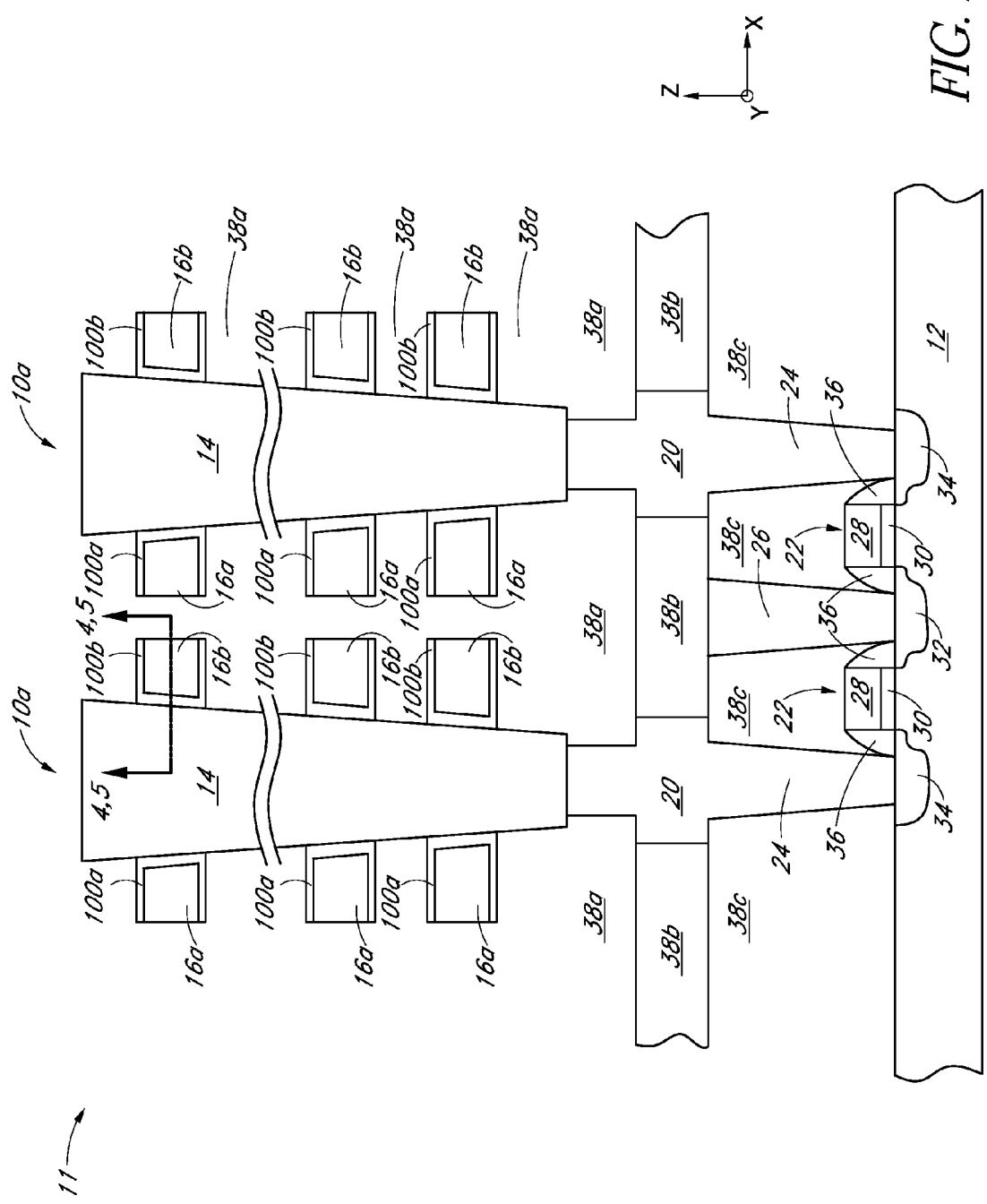
FIG. 2 is a schematic cross-sectional illustration of a 3D RRAM array according to some other embodiments.

FIG. 2 illustrates a cross-sectional view of 3D-RRAM array 40 according to some other embodiments. The overall array architecture of the 3D-RRAM array 40 may be similar to that of the 3D-RRAM array 10 of FIG. 1, and the 3D-RRAM array 40 also includes a plurality of sub-arrays 10a.

The overall sub-array architecture illustrated in FIG. 2 may also be similar to the example of intersecting word line architecture discussed above in connection with FIG. 1, except for certain features, which are described herein. For example, similar to FIG. 1, the second electrode lines 14 extend through a vertical via extending in the z-direction through a stack of pairs of first electrode lines 16a and 16b and interposing inter-layer dielectrics 38a. Unlike the embodiment of FIG. 1, however, first and second resistive switching stacks 100a and 100b of the intersecting word line architecture in FIG. 2 do not line the vertical vias. Instead, first and second resistive switching stacks 100a and 100b line a horizontal cavity formed upon removal of sacrificial first electrode materials, in a similar manner as described above in connection with the bitline-last flow. Accordingly, the second electrode lines 14 fill entire volumes of vertical vias to form cylindrical rods because there is no underlying resistive switching stack.

As a result, the resulting array architecture is similar to the intersecting word line architecture of FIG. 1 in some aspects. For example, each of the pair of electrodes 16a and 16b form elongated lines extending in -they-direction and "share" one second electrode 14 such that two conductive paths are formed for each RRAM cell formed at each of the intersections between one of the first electrodes 16a and 16b and a second electrode 14. Thus, in this embodiment, the RRAM cell comprises a second electrode line 14rod extending in the z-direction, a pair of first electrode lines 16a and 16b extending in the y direction and forming a pair of intersections with the second electrode line 14, and resistive switching stacks 100a and 100b interposed between first electrode lines 16a and 16b and the second electrode line 14 at the pair of intersections.

The process flow to fabricate the 3D-RRAM array 40 is also similar to the "bitline last" process flow discussed in connection with FIG. 1 in some aspects, except that the resistive switching stacks 100a and 100b are not deposited prior to filling vias with second electrode materials to form the second electrodes 14. Instead, the resistive switching stacks 100a and 100b are conformally deposited in the horizontal recessed cavities formed by removal of sacrificial first electrode layers. The materials and the processes employed to deposit the resistive switching stacks 100a and 100b are similar as in the bit line-last process described above in FIG. 1. Also similar to the bit line-last process described above in FIG. 1, the horizontal cavities formed by removal of sacrificial first electrode layers are then filled with a suitable permanent first electrode material, which includes substantially the same materials as suitable second electrode materials discussed above. In addition, the first electrode material can be deposited using a suitable process for depositing a substantially conformal film into the horizontal cavities, similar to processes used for second electrode material deposition in FIG. 1. Thus, as discussed above in connection with the bitline-first flow of FIG. 1, thermal ALD processes may be preferable compared to PE-ALD for the deposition of resistive switching stacks 100a and 100b, as well as the permanent first electrode material, so as to avoid undesirable structural effects arising from non-uniform plasma exposure such as higher amounts of the second electrode material being deposited in horizontal cavities located near the opening of an inter-sub-array gap compared to horizontal cavities located deeper in the inter-sub-array gap, The 3D-RRAM array 40 having intersecting word line array architecture fabricated using the bitline-last process flow of FIG. 2 may be advantageous over the bitline-first process of FIG. 1 in some aspects. For example, the resistive switching stack 100a and 100b are not exposed to etch and clean chemistries prior to being capped with the second electrode material, thus minimizing contamination and other processing issues such as formation of pinholes in the resistive switching stack.

Previous paragraphs so far addressed 3D RRAM architectures. However, RRAM memory cells according to other embodiments can also be used in embedded nonvolatile memory applications which typically have planar structures based on, e.g., 1T1R configuration (1 transistor 1 resistive element). In this configuration, a resistive element and comprising a first electrode, a switching oxide and a top electrode, can be integrated in several metal levels.

As discussed above, the conducting path of a RRAM cell disposed at an intersection formed by a first electrode line 16 and a second electrode line 14 can be programmed to be in a relatively high resistance state, also known as the RESET state. Similarly, the conducting path of any one of the RRAM cells can be programmed to be in a relatively low resistance state, also known as the SET state. In one embodiment, high and low resistance states may correspond to the "1" state and a "0" state in a single bit-per-cell memory system.

Figure 3:
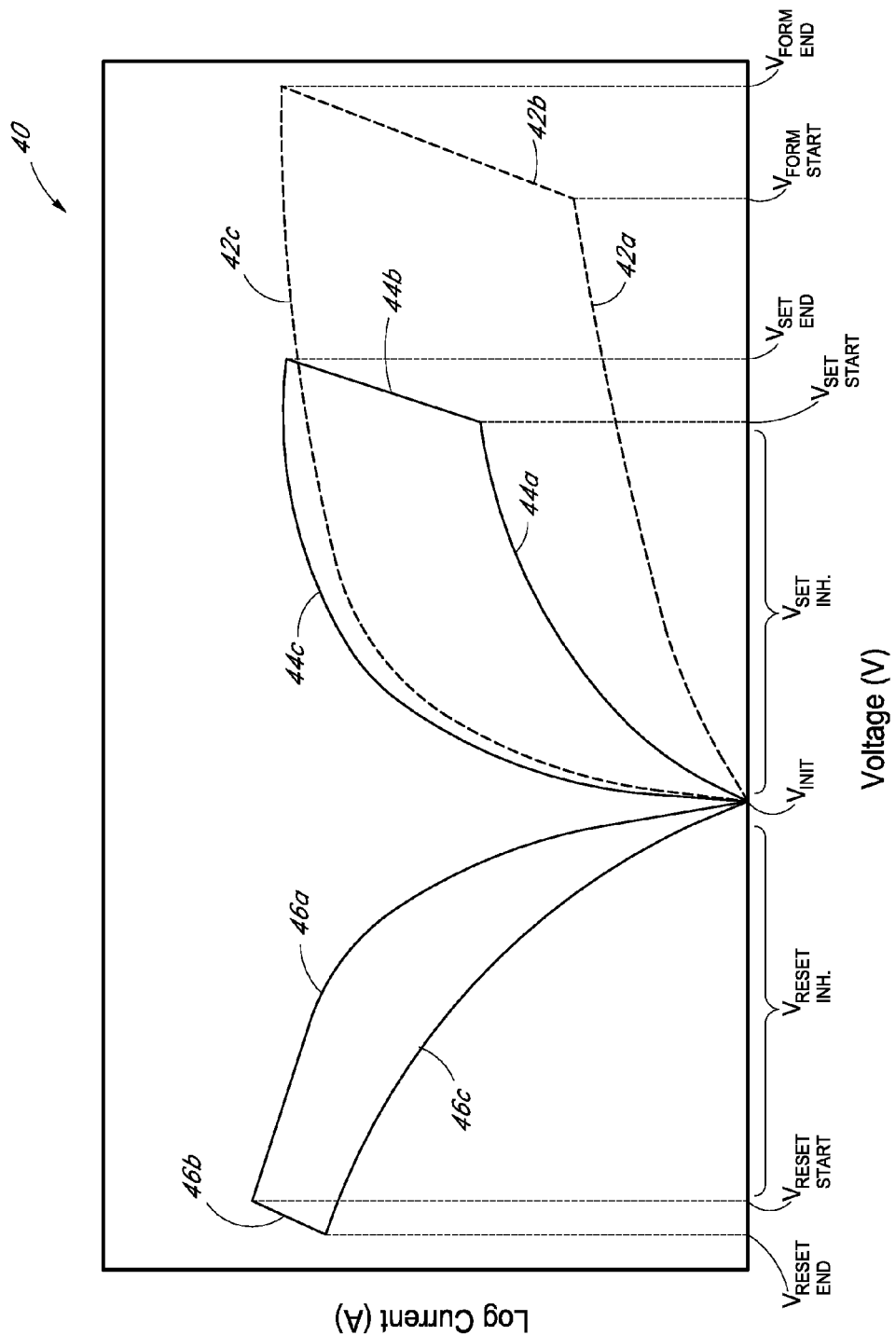
FIG. 3 is a schematic illustration of current-voltage relationships of switching operations of an RRAM cell according to some embodiments.

FIG. 3 represents schematic current-voltage (I-V) curves 40 representing three access operations that can change the state of an RRAM cell. A forming operation refers to the very first electrical pulse applied to an as-fabricated RRAM cell. An electrical pulse, as referred to herein, can include a suitable voltage or current pulse. In addition, the electrical pulse can have varying degrees of voltage and/or current while being applied, e.g., a DC voltage sweep. In FIG. 3, the x-axis represents a voltage applied across the RRAM cell. The y-axis represents the current flowing through the RRAM cell stack at a given voltage.

In FIG. 3, an I-V curve representing the forming operation include a pre-forming high resistance state (HRS) I-V portion 42a ranging in the voltage axis from an initial voltage $V_{INIT}$ to a forming starting voltage $V_{FORM\ START}$ and is characterized by a relatively slow increase in current for a given change in voltage. The I-V curve representing the forming operation further includes a forming HRS-to-LRS transition I-V portion 42b ranging in the voltage axis from $V_{FORM\ START}$ to $V_{FORM\ END}$ and is characterized by a relatively sharp increase in current for a given change in voltage, during which the RRAM cell changes its state from a pre-forming HRS to a post-formed low resistance state (LRS). The I-V curve representing the return path from $V_{FORM\ END}$ to $V_{INIT}$ is represented by a first LRS return path I-V portion 42c.

In some embodiments, forming voltages $V_{FORM\ START}$ and $V_{FORM\ END}$ is related to a breakdown voltage (BV) of the resistive switching material, which can be proportional to the break down electric field. Thus, the forming voltages can depend on factors such as the thickness, density, composition, and the overall quality, among other characteristics, of the resistivity switching oxide layer. As such, these voltages may be controlled by adjusting the deposition parameters such as the deposition temperature and ALD cycle times.

An I-V curve representing the RESET operation include a LRS I-V portion 46a ranging in the voltage axis from an initial voltage $V_{INIT}$ to a RESET starting voltage $V_{RESET\ START}$ and is characterized by a relatively slow decrease in current for a given change in voltage. The I-V curve representing the RESET operation further includes a RESET LRS-to-HRS transition I-V portion 46*b* ranging in the voltage axis from $V_{RESET\ START}$ to $V_{RESET\ END}$ and is characterized by a relatively sharp decrease in current for a given change in voltage, during which the RRAM cell changes its state from the LRS to HRS. The I-V curve representing the return path from $V_{RESET\ END}$ to $V_{INIT}$ is represented by a HRS return path I-V portion 46*c*.

An I-V curve representing the SET operation include a HRS I-V portion 44*a* ranging in the voltage axis from an initial voltage $V_1$ to a SET starting voltage $V_{SET}$ START and is characterized by a relatively slow increase in current for a given change in voltage. This I-V portion is leakier than the analogous I-V portion of the forming I-V curve. The I-V curve representing the SET operation further includes a SET HRS-to-LRS transition I-V portion 44*b* ranging in the voltage axis from $V_{SET\ START}$ to $V_{SET\ END}$ and is characterized by a relatively sharp increase in current for a given change in voltage, during which the RRAM cell changes its state from the HRS to LRS. The I-V curve representing the return path from $V_{SET\ END}$ to $V_{INIT}$ is represented by a second LRS return path I-V portion 44*c*.

As discussed above, a non-linear current-voltage I-V can be advantageous in some applications, for example, in reducing leakage current from memory cells that are inhibited during an access operation (e.g., a write or read). Still referring to FIG. 3, when a target memory cell is accessed according to a SET operation or a RESET operation as described above by applying an access voltage across a selected bitline and a selected wordline, unselected bitlines and unselected wordlines can be inhibited by applying inhibit biases across the unselected bitlines and wordlines. For example, depending on the array configuration, the I-V curves 40 illustrate that inhibited cells during a SET operation can receive an inhibit bias $V_{SET\ INH}$ between $V_{INIT}$ and $V_{SET\ START}$. Similarly, inhibited cells during a RESET operation can receive an inhibit bias $V_{RESET\ INH}$ between $V_{INIT}$ and $V_{RESET}$ INH. The amount of leakage current an inhibited cell can conduct while being inhibited depends on, among other things, the degree of nonlinearity of the I-V curve associated with the operation.

As used herein, the degree of nonlinearity can be defined as the ratio between the current through the RRAM cell at a SET switching voltage (e.g., $V_{SET\ START}$) and the current through the RRAM cell at SET inhibit voltage, which can be defined as ½ of the SET switching voltage (e.g., $V_{SET\ START}/2$). As an illustrative example, if the current of a cell in the HRS state at the SET inhibit voltage is 1/1000 of the current at $V_{SET\ START}$, the degree of nonlinearity would be 1000. In this example, if there are 1000 cells in the HRS being inhibited, the total leakage from the 1000 cell can be approximately the same as the current through the cell being switched from HRS to LRS. Similarly, if the current of a cell in the LRS state at the SET inhibit voltage is 1/100 of the current at $V_{SET\ START}$, the degree of nonlinearity would be 100 and if there are 100 cells in the HRS being inhibited, the total leakage from the 100 cell can be approximately the same as the current through the cell being switched from HRS to LRS. Thus, if the array design rule dictates that the total leakage current not exceed the access current, these leakage currents can limit the overall size of the array under a given bias scheme. Advantageously, various embodiments can provide high degrees of non-linearity.

Figure 4A:
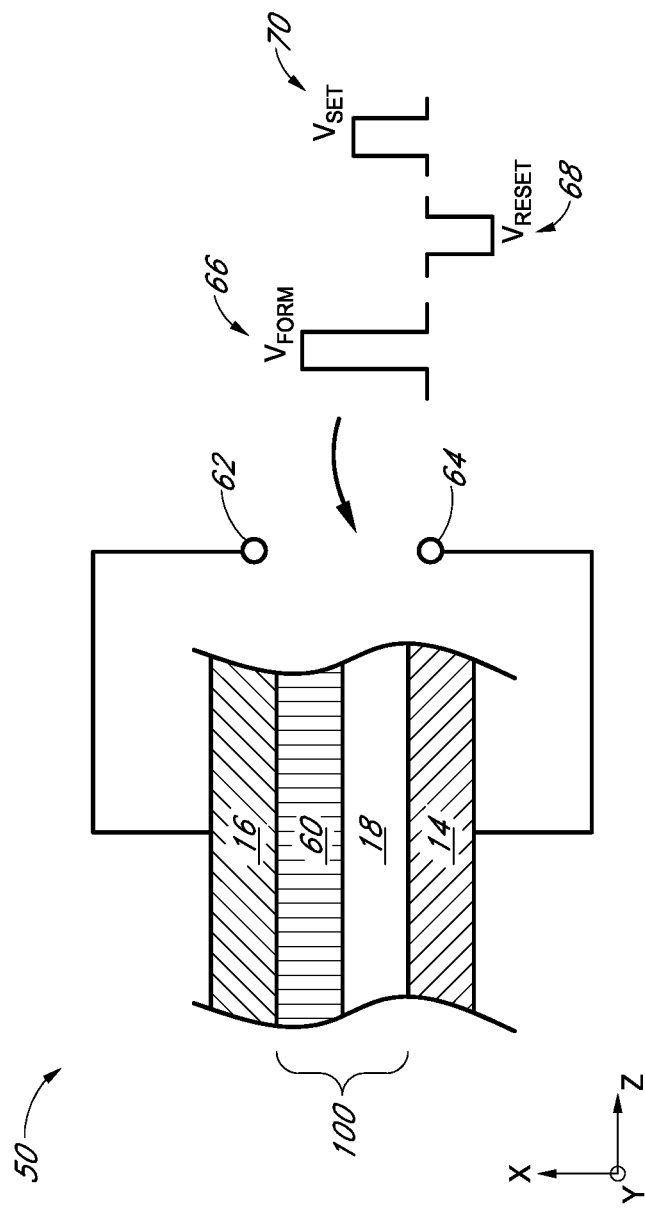
FIG. 4A is a schematic cross-sectional illustration of an RRAM cell stack according to some embodiments.

Referring to FIG. 4A, details, according to some embodiments, of material stacks that comprise the RRAM cells of FIGS. 1 and 2 are disclosed herein. An RRAM cell stack 50 of FIG. 4A can represent a cross-section an RRAM cell taken along the plane 4,5 in FIGS. 1 and 2. The RRAM cell stack 50 comprises a first electrode 16, a second electrode 14, and a resistive switching stack 100 is interposed between the first electrode 16 the second a. The resistive switching stack 100 in turn comprises a resistive switching material 18 comprising an oxide of a pnictogen element, which may be formed by atomic layer deposition (ALD), and a metallic material 60 comprising the pnictogen element, which may also be formed by ALD. The resistive switching material 18 is interposed the second electrode 14 and the metallic material 60.

In some embodiments, the pnictogen is an element chosen from a group consisting of As, Bi, Sb, and P. In some particularly advantageous embodiments, the pnictogen comprises Sb.

Generally, a film growth by ALD occurs through a reaction between atomic layers of adsorbed precursors. In a thermal ALD growth process, the film growth occurs through a surface reaction that is driven by thermal energy imparted from the temperature of the substrate. In contrast, in a plasma-enhanced (PE-ALD) growth process, the film growth occurs through a surface reaction that is at least partially driven by a plasma process. As used herein, a thermal ALD process is performed without use of a plasma. It will be appreciated that thermal and plasma ALD may be utilized to deposit various features, such as the resistive switching material 18 and the metallic material 60. As discussed herein, however, depending on the context for the deposition, thermal ALD may provide particular advantages in some embodiments.

For the various ALD depositions described herein, the substrate surface to be deposited upon may be alternatingly exposed to mutually reactive precursors, with a deposition cycle including absorption of a first precursor on the deposition surface and then reaction of the absorbed precursor by a second mutually reactive precursor to form a "monolayer" of a reaction product. The cycles (sequential exposures to the first and second precursors) are repeated and the monolayers are deposited over one another until the deposited material reaches a total desired thickness. In some embodiments, the alternating exposure is accomplished by flowing precursors in temporally separated pulses into a deposition chamber that accommodates the substrate. In some other embodiments, the alternating exposure may be accomplished by movement of the substrate and/or reactor parts, without pulsing precursors into the deposition chamber at different times.

In some embodiments, after exposing the substrate to a precursor and before exposing the substrate to another precursor, the substrate may be subjected to a purge step to remove non-absorbed or non-reacted precursor from the vicinity of the substrate. This purge may be accomplished by flowing an inert gas onto the substrate and/or by evacuation of the atmosphere around the substrate. For example, the deposition chamber may be filled with inert gas and/or evacuated with a vacuum pump. It will be appreciated that the deposition chamber may be part of a single substrate reactor, designed to accommodate a single substrate at a time, or the chamber may accommodate multiple substrates, e.g., the chamber may be the deposition chamber of a batch reactor.

With continued reference to FIG. 4A, in some embodiments, the resistive switching material 18 comprises a pnictogen oxide, e.g., an antimony oxide deposited using an antimony source or precursor comprising an antimony halide, an antimony alkoxide or an antimony alkylamine compound. As non-limiting examples, the antimony alkoxide may be Sb(OEt)$_3$; the antimony halide reactant may be SbCl$_3$; and the antimony alkylamine reactant may be Sb(N(CH3$_2$)$_2$)$_3$. The oxygen source may be, for example, ozone. In some embodiments the oxygen source comprises plasma. In some embodiments the oxygen source is an oxygen-containing precursor other than water. Details of the Sb and oxygen reactants that can be used is described below.

In some embodiments the antimony reactant comprises an antimony halide. For example, the antimony halide may be SbCl$_3$. In other embodiments the antimony halide may be SbBr$_3$, SbF$_3$ or SbI$_3$. In some embodiments the antimony halide comprises at least one halide ligand. In some embodiments the antimony halide is SbX$_z$A$_{3-z}$, wherein z is from 1 to 3 and A is a ligand comprising alkylamine, a halide different from X, or an amine, silyl, alkoxide or alkyl group.

In some embodiments the antimony reactant comprises an antimony alkoxide. For example, the antimony reactant may comprise Sb(OEt)$_3$. In some embodiments the antimony reactant may comprise Sb(OR)$_3$, wherein R is a linear, branched, or cyclic, saturated or unsaturated, C1-C12 alkyl or alkenyl group. The alkyl or alkenyl might also be substituted with substituents such as halogens, amines, silyls etc. In some embodiments the antimony reactant may comprise Sb(OR)$_x$A$_{3-x}$, wherein x is from 1 to 3. R is a linear or branched, cyclic or linear, saturated or unsaturated, C1-C12 alkyl or alkenyl group. The alkyl or alkenyl might also be substituted with substituents like halogens, amines, and silyls. A is a ligand comprising alkylamine, halide, amine, silyl or alkyl.

While antimony oxide can be deposited using antimony halides or antimony alkoxides as antimony sources, as described herein, in some embodiments other types of antimony sources can be used, such as antimony alkylamines and antimony alkyls.

In some embodiments antimony alkylamines are used. The antimony reactant may comprise, for example, Sb(NR$_2$)$_x$A$_{3-x}$, wherein x is from 1 to 3, and R can be linear, branched or cyclic, saturated or unsaturated, C1-C12 alkyl or alkenyl group. In some embodiments the alkyl or alkenyl might also be substituted with substituents such as halogens, amines, silyls etc. A can be a ligand comprising alkylamine, halide, amine, silyl or alkyl. A specific example of this kind precursor is tris(dimethylamine)antimony, Sb(NMe$_2$)$_3$. Other non-limiting examples are C2-C3 variants: Sb(NEt$_2$)$_3$, Sb(NPr$_2$)$_3$ and Sb(N$^1$Pr$_2$)$_3$. The R in Sb(NR$_2$)$_3$ can be linear or branched, cyclic or linear, saturated or unsaturated, C1-C12 alkyl or alkenyl group. The alkyl or alkenyl might also be substituted with substituents like halogens, amines, silyls etc.

Other types of antimony compounds that can be used are antimony alkyls having the formula SbR$_x$A$_{3-x}$, wherein x is from 1 to 3, R can be a linear, branched, or cyclic, saturated or unsaturated, C1-C12 alkyl or alkenyl group. In some embodiments the alkyl or alkenyl can also be substituted with substituents like halogens, amines, silyls etc. A is a ligand comprising alkylamine, halide, amine, silyl or alkyl.

While in some of the above-mentioned antimony compounds the oxidation state of antimony is +III, similar antimony compounds, such as alkoxides, halides, alkyls and alkylamines or mixtures or derivatives thereof, can be use that have different antimony oxidation states, like +V.

In some embodiments the oxygen source material for reacting with the antimony source is selected from the group consisting of water, oxygen, hydrogen peroxide, aqueous solution of hydrogen peroxide, ozone, atomic oxygen, oxides of nitrogen, peracids (—O—O—H), alcohols, oxygen-containing radicals and mixtures thereof. Other oxygen sources can also be employed, such as remotely or in situ generated oxygen plasma.

The oxygen source may be a mixture of oxygen and inactive gas, such as nitrogen or argon. In some embodiments the oxygen source may be a molecular oxygen-containing gas. In some embodiments the oxygen content of the oxygen-source gas is from about 10 to 25%. Thus, one source of oxygen may be air. In some embodiments, the oxygen source is molecular oxygen. In some embodiments, the oxygen source comprises an activated or excited oxygen species.

In some embodiments, the oxygen source comprises ozone. The oxygen source may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, ozone is formed inside the reactor, for example by conducting oxygen containing gas through an arc.

In some other embodiments, an oxygen-containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of remote plasma, the pathway to the substrate can be optimized to maximize electrically neutral species and minimize ion survival before reaching the substrate.

In some embodiments water is not used as the oxygen source. In some embodiments water is used as an oxygen source. In other embodiments, water is used in combination with one or more additional oxygen sources. The water may be provided with the additional oxygen source or separately. In some embodiments a substrate is exposed to water prior to a exposure to a second oxygen source, such as ozone. In other embodiments, exposure to water is provided subsequent to exposure to a second oxygen source, such as ozone.

In some embodiments, the resistive switching material 18 may include a sub-stoichiometric metal oxide, which may be represented by MO$_x$, where M is a pnictogen metal, O is oxygen, and x represents a value less than the stoichiometric saturation value. For example, in embodiments where the resistive switching material 18 includes antimony oxide, the stoichiometry of the antimony oxide deposited by ALD may be SbO$_x$, where x is from about 1 to about 3. In some embodiments the stoichiometry of the antimony oxide may be Sb$_2$O$_3$, Sb$_2$O$_5$ or mixtures thereof. In some embodiments the stoichiometry of the antimony oxide is Sb$_2$O$_3$. In other embodiments the stoichiometry of the antimony oxide is Sb$_2$O$_5$. In some embodiments the stoichiometry of the antimony oxide is a mixture of Sb$_2$O$_3$ and Sb$_2$O$_5$. In other embodiments the antimony oxide has a different stoichiometry.

Deposition temperatures of the resistive switching material 18 can depend upon the surface termination and reactant species involved. In some embodiments, the temperature is preferably about 500° C. or less, about 450° C. or less, about 400° C. or less, or about 350° C. or less. In some embodiments the deposition temperature is about 50° C. to about 400° C., or about 50° C. to about 350° C. For example, for SbCl$_3$, the deposition temperature is preferably at or above about 35° C., for example about 35° C. to about 500° C., or about 50° C. to about 400° C. In another example, for Sb(OEt)$_3$, the deposition temperature is preferably at or above about room temperature, for example about room temperature to about 500° C., or about 20° C. to about 400° C.

In other embodiments, the resistive switching material 18 comprises antimony oxide deposited by ALD under other conditions, such as those described in U.S. patent application Ser. No. 13/649,992, filed Oct. 11, 2012 (U.S. Application Publication 2013/0095664), the entire disclosure of which is incorporated herein by reference.

In some embodiments, the metallic material 60 comprises antimony deposited by ALD using an antimony source similar to those used to form the resistive switching material 18, as discussed above, including an antimony halide, an antimony alkoxide or an antimony alkylamine compound. Examples of precursors that may be used in various ALD processes disclosed herein are discussed below.

In some embodiments Sb precursors that may be used include, Sb halides, such as SbCl$_3$ and SbI$_3$, Sb alkoxides, such as Sb(OEt)$_3$ and Sb amides.

In some embodiments the Sb precursor has Sb bound to three silicon atoms. For example it can have a general formula of Sb(AR$^1$R$^2$R$^3$)$_3$, wherein A is Si or Ge, and R$^1$, R$^2$, and R$^3$ are alkyl groups comprising one or more carbon atoms. Each of the R$^1$, R$^2$ and R$^3$ ligands can be selected independently of each other. The R$^1$, R$^2$, and R$^3$ alkyl groups can be selected independently of each other in each ligand based on the desired physical properties of the precursor such as volatility, vapor pressure, toxicity, etc. In some embodiments, R$^1$, R$^2$ and/or R$^3$ can be hydrogen, alkenyl, alkynyl or aryl groups. In some embodiments, R$^1$, R$^2$, R$^3$ can be any organic groups containing heteroatoms, such as N, O, F, Si, P, S, Cl, Br or I. In some embodiments R$^1$, R$^2$, R$^3$ can be halogen atoms. In some embodiments the Sb precursor have a general formula of Sb(SiR$^1$R$^2$R$^3$)$_3$, wherein R$^1$, R$^2$, and R$^3$ are alkyl groups comprising one or more carbon atoms. In some embodiments, R$^1$, R$^2$ and/or R$^3$ can be unsubstituted or substituted C$_1$-C$_2$ alkyls, such as methyl or ethyl groups. The R$^1$, R$^2$, and R$^3$ alkyl groups can be selected independently of each other in each ligand based on the desired physical properties of the precursor such as volatility, vapor pressure, toxicity, etc In some embodiments the Sb precursor is Sb(SiMe$_2^t$Bu)$_3$. In other embodiments the precursor is Sb(SiEt$_3$)$_3$ or Sb(SiMe$_3$)$_3$. In more preferred embodiments the precursor has a Sb—Si bond and most preferably a three Si—Sb bond structure.

In some embodiments the Sb precursor has a general formula of Sb[A$^1$(X$^1$R$^1$R$^2$R$^3$)$_3$][A$^2$(X$^2$R$^4$R$^5$R$^6$)$_3$][A$^3$(X$^3$R$^7$R$^8$R$^9$)$_3$] wherein A$^1$, A$^2$, A$^3$ can be independently selected to be Si or Ge and wherein R$^1$, R$^2$, R$^3$, R$^4$, R$^5$, R$^6$, R$^7$, R$^8$, and R$^9$, can be independently selected to be alkyl, hydrogen, alkenyl, alkynyl or aryl groups. In some embodiments, R$^1$, R$^2$, R$^3$, R$^4$, R$^5$, R$^6$, R$^7$, R$^8$, and R$^9$ can be any organic groups containing also heteroatoms, such as N, O, F, Si, P, S, Cl, Br or I. In some embodiments one or more R$^1$, R$^2$, R$^3$, R$^4$, R$^5$, R$^6$, R$^7$, R$^8$, and R$^9$ can be halogen atoms. In some embodiments X$^1$, X$^2$, and X$^3$ can be Si, Ge, N, or O. In some embodiments X$^1$, X$^2$, and X$^3$ are different elements. In embodiments when X is Si then Si will be bound to three R groups, for example Sb[Si(SiR$^1$R$^2$R$^3$)$_3$][Si(SiR$^4$R$^5$R$^6$)$_3$] [Si(SiR$^7$R$^8$R$^9$)$_3$]. In embodiments when X is N then nitrogen will only be bound to two R groups Sb[Si(NR$^1$R$^2$)$_3$][Si(NR$^3$R$^4$)$_3$][Si(NR$^5$R$^6$)$_3$]. In embodiments when X is O, the oxygen will only be bound to one R group, for example Sb[Si(OR$^1$)$_3$][Si(OR$^2$)$_3$][Si(OR$^3$)$_3$]. R$^1$, R$^2$, R$^3$, R$^4$, R$^5$, R$^6$, R$^7$, R$^8$, and R$^9$ groups can be selected independently of each other in each ligand based on the desired physical properties of the precursor such as volatility, vapor pressure, toxicity, etc.

In some embodiments, the Sb precursor is selected from the group consisting of: Sb[Si(SiR$^1$R$^2$R$^3$)$_3$][Si(SiR$^4$R$^5$R$^6$)$_3$] [Si(SiR$^7$R$^8$R$^9$)$_3$], Sb[Si(NR$^1$R$^2$)$_3$][Si(NR$^3$R$^4$)$_3$][Si(NR$^5$R$^6$)$_3$], Sb[Si(OR$^1$)$_3$][Si(OR$^2$)$_3$][Si(OR$^3$)$_3$], and Sb[SiR$^1$R$^2$][SiR$^3$R$^4$][SiR$^5$R$^6$] with a double bond between silicon and one of the R groups. In other embodiments the Sb precursor comprises: a ring or cyclical configuration comprising a Sb atom and multiple Si atoms; or comprises more than one Sb atom. In these embodiments R$^1$, R$^2$, R$^3$, R$^4$, R$^5$ and R$^6$, are selected from the group consisting of alkyl, hydrogen, alkenyl, alkynyl, or aryl groups.

In some embodiments the Sb precursor has a formula similar to the formulas described above, however the Si atom has a double bond to one of the R groups in the ligand (e.g. Sb—Si=). For example, a partial structure of the precursor formula is represented below:

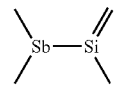

In some embodiments the precursor contains multiple atoms of Si and Sb. For example, a partial structure of a precursor in one embodiment is represented below:

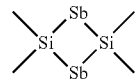

The Si and Sb atoms in the partial formulas pictured above can also be bound to one or more R groups. In some embodiments, any of the R groups described herein can be used.

In some embodiments the precursor contains a Si—Sb—Si bond structure in a cyclical or ring structure. For example, a partial structure of a precursor in one embodiment is represented below.

The R group can comprise an alkyl, alkenyl, alkynyl, alkylsilyl, alkylamine or alkoxide group. In some embodiments the R group is substituted or branched. In some embodiments the R group is not substituted and/or is not branched. The Si and Sb atoms in the partial formula pictured above can also be bound to one or more R groups. In some embodiments, any of the R groups described herein can be used.

Deposition temperatures of the metallic material 60 can depend upon the surface termination and reactant species involved. In some embodiments, the temperature is similar to that used to deposit the resistive switching material 18.

In a preferred embodiment the Sb layer is formed by exposing the substrate alternatingly to a first Sb precursor and a second Sb precursor. The first Sb precursor is selected from the group of $SbCl_3$, $SbI_3$ and $SbI_3$. The second precursor has the general formula $Sb(SiR^1R^2R^3)_3$ wherein $R^1$, $R^2$ and $R^3$ are independently selected alkyl groups. Preferably, the first precursor is $SbCl_3$ and the second precursor is $Sb(SiEt_3)_3$ and the growth temperature ranges from 80° C. to 120° C.

In some other embodiments, the metallic material 60 comprises antimony deposited by ALD using other antimony sources and deposition conditions, such as those described in U.S. patent application Ser. No. 13/504,079, filed Sep. 17, 2012 (U.S. Application Publication 2012/0329208), the entire disclosure of which is incorporated herein by reference.

As discussed above, the resistive switching material 18 can have sub-stoichiometric composition to control the switching behavior of the RRAM device. For example, without being bound to any theory, sub-stoichiometric composition of an oxide can give rise to charged oxygen vacancies within the oxide, which can become mobile under switching conditions of the RRAM device. In some embodiments, the composition can be tuned to obtain particular switching and other parameters of the RRAM device, such as the switching voltage, switching current, and data retention.

In some embodiments, the resistive switching behavior can be controlled by forming a suitable metallic material as the metallic material 60 between the resistive switching layer 18 and one or both of the first and second electrodes. In these embodiments, the metallic material 60 can intermix with the resistive switching material 18 during subsequent processes or during device operation to provide the desired switching characteristics. In some implementations, metals that form the metallic material 60 include pnictogen metals, which may also be a constituent metal of the resistive switching material 18. In other embodiments, the metallic material 60 can include other metals, including Ni, Hf, Zr, Cu, Ta, Ti, Si, and Al, among others.

In some embodiments, the thickness of the resistive switching material 18 has a range between about 40 nm and about 1 nm, for instance about 20 nm. In another embodiment, the thickness of the resistive switching material 18 has a range between about 20 nm and about 1 nm, for instance about 10 nm. In yet another embodiment, the thickness of the resistive switching material 18 has a range between about 10 nm and about 1 nm, for instance about 5 nm.

In some embodiments, the thickness of the metallic material 60 has a range between about 40 nm and about 1 nm, for instance about 20 nm. In another embodiment, the thickness of the metallic material 60 has a range between about 20 nm and about 1 nm, for instance about 10 nm. In yet another embodiment, the thickness of the metallic material 60 has a range between about 10 nm and about 1 nm, for instance about 5 nm.

In some embodiments, either one or both of first and second electrodes 16 and 16, which may be 14 formed by ALD, e.g. thermal ALD, includes a TiN layer formed at a temperature below about 400° C. In some other embodiments, one or both of first and second electrodes 16 and 14 includes a TiN layer formed by ALD, e.g. thermal ALD, at a temperature between about 300° C. and about 400° C., or between about 300° C. and about 350° C.

In some embodiments, either one or both of first and second electrodes 16 and 14 formed by thermal ALD includes a TiN layer having a thickness of about 1 nm to about 100 nm. In some other embodiments, one or both of first and second electrodes 14 and 16 includes a TiN layer having a thickness of about 5 nm to about 50 nm. In yet other embodiments, one or both of first and second electrodes 16 and 14 includes a TiN layer having a thickness of about 5 nm to about 30 nm, for instance 10 nm.

In operation, the first and second electrodes 14 and 16 can be electrically connected to first and second pads 62 and 64. The relative biasing of the first and second pads 62 and 64 can depend on whether the metallic material 60 is interposed between the resistive switching material 18 and the second electrode 14 or between the resistive switching material 18 and the second electrode 18. In some embodiments where the metallic material 60 intermixes with the resistive switching material 18, the forming or the SET operation can be performed under a biasing condition where the first electrode 16 is biased positively relative to the second electrode 14 using positive pulses $V_{FORM}$ 66 and $V_{SET}$ 70, respectively, and the RESET operation can be performed using a negative pulse $V_{RESET}$ 68. Without being bound to any theory, such a biasing scheme can give rise to a net movement of metal atoms or oxygen vacancies that may originate from the side of the first electrode 16 towards the side of the second electrode 14, a net movement of oxygen atoms from the side of the second electrode 14 towards the side of the first electrode 16, or both net movements of metal atoms and oxygen atoms in opposite directions. In this connection, depending on the integration scheme chosen in FIGS. 1 and 2, it may be advantageous to have the metallic material 60 interposed between the resistive switching material 18 and the first electrode 16 as illustrated in FIG. 4A, or have the metallic material 60 interposed between the resistive switching material 18 and the second electrode 14. In the latter configuration having the metallic material 60 interposed between the resistive switching material 18 and the second electrode 14, the pulses $V_{FORM}$ 66, $V_{SET}$ 70 and $V_{RESET}$ 70 can be biased in opposite polarities to those shown in FIG. 4A.

Figure 4B:
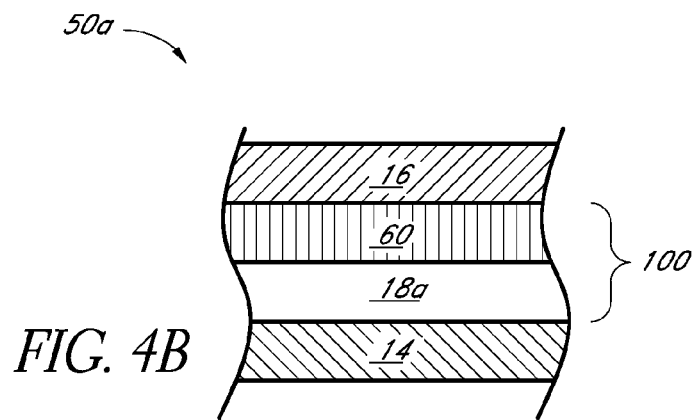
FIGS. 4B-4D are schematic cross-sectional illustrations of the RRAM cell stack of FIG. 4A at various stages of operation, according to some embodiments.
Figure 4C:
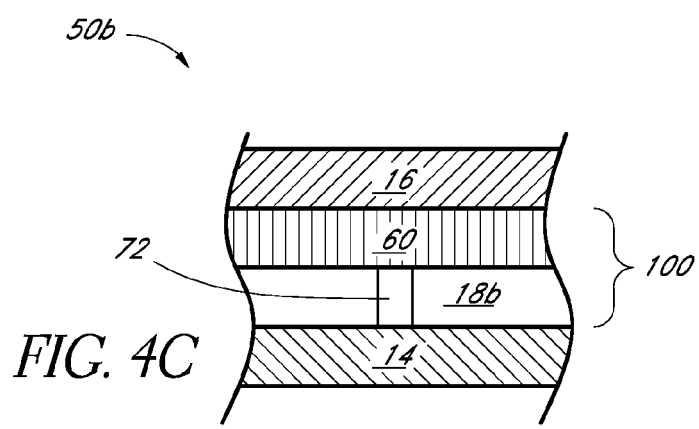
Figure 4D:
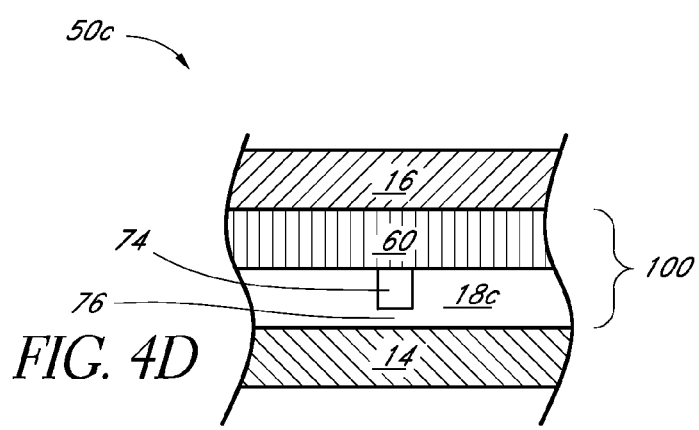

In FIGS. 4B to 4D physical changes to the resistive switching stack 100 during operation is described, according to some embodiments. FIG. 4B illustrates a cross-sectional view of an unformed RRAM cell stack 50a of the RRAM cell of FIG. 4A, according to some embodiments. Similar to FIG. 4A, the unformed RRAM cell stack 50a may comprise a first electrode 16, a second electrode 14, and a resistive switching stack 100 comprising a resistive switching material 18a comprising an oxide of a pnictogen element formed by atomic layer deposition (ALD), and a metallic material 60 comprising the pnictogen element formed by ALD, wherein the resistive switching stack 100 is interposed between the first electrode 16 and the second electrode 14, and the resistive switching material 18a is interposed between the first electrode 16 the metallic material 60. The unformed RRAM cell stack 50a of FIG. 4B can be characterized by relatively homogeneous resistive switching material 18a without substantially localized conduction paths. Electrically, the unformed RRAM cell stack 50a can display a relatively homogenous conduction through the resistive switching material 18a. For example, unformed RRAM cell stacks 50a having different areas can display a relatively constant current density under a moderate read bias smaller than switching biases $V_{FORM}$ 66, $V_{SET}$ 70 and $V_{RESET}$ 70.

FIG. 4C illustrates a cross-sectional view of an as-formed or as-SET RRAM cell stack 50b of the RRAM cell of FIG. 4A, according to some embodiments. That is, the as-formed or as-SET RRAM cells stack 50b can represent the RRAM cell stack 50a after receiving pulses $V_{FORM}$ 66 and $V_{SET}$ 70 as illustrated in FIG. 4A. Similar to FIG. 4B, the as-formed or as-SET RRAM cell stack 50b may comprise a first electrode 16, a second electrode 14, and a resistive switching stack 100 comprising a resistive switching material 18b comprising an oxide of a pnictogen element formed by atomic layer deposition (ALD), and a metallic material 60 comprising the pnictogen element formed by ALD, wherein the resistive switching stack 100 is interposed between first electrode 16 and the second electrode 14. The metallic material 60 is interposed between the first electrode 16 and the resistive switching material 18. In addition, the as-formed or as-SET RRAM cell stack 50b can include a localized conduction path 72 within the resistive switching material 18a that may develop within a relatively homogeneous resistive switching material 18a of FIG. 4B under biased pulses $V_{FORM}$ 66 and $V_{SET}$ 70. Without being bound to any theory, it will be appreciated that the localized conduction path 72 can develop for a number of reasons. For example, the localized conduction path 72 can be initiated at a localized region where the electric field can be enhanced due to a smaller resistive switching material thickness and/or a relatively sharp boundary between the resistive switching material 18a and the metallic material 60 and/or a relatively sharp boundary between the resistive switching material 18a and the second electrode 14.

In some embodiments, the localized conduction path 72 can have a localized stoichiometry substantially different from the bulk resistive switching material 18b. For example, where the resistive switching material 18b of FIG. 4C is represented by $MO_x$, where M is a pnictogen metal, O is oxygen, and x represents a value equal to or less than the stoichiometric saturation value, the localized conduction path 72 can be represented by $MO_y$, where y is substantially less than x, for example by greater than 10%. Without being bound to any theory, such differences in composition between the localized conduction path 72 and the bulk resistive switching material 18b can be associated with movements of metallic atoms or ions, movements of oxygen atoms or ions, movement of oxygen vacancies, or any combination thereof, into and/or out of the conductive path 72 and the surrounding regions.

In some embodiments, the as-SET RRAM cell stack 50b of FIG. 4B can be characterized electrically by a relatively localized conduction through the localized conduction region 72. For example, as-SET RRAM cell stack 50b having different areas can display a relatively constant current under a moderate read bias smaller than switching biases.

In some embodiments, the as-formed or as-SET RRAM cell stack 50b of FIG. 4B can be characterized electrically by a relatively Ohmic conduction having a relatively linear current-voltage (I-V) relationship. In other embodiments, the as-formed or as-SET RRAM cell stack 50b of FIG. 4B can be characterized electrically by a relatively non Ohmic conduction having a relatively nonlinear current voltage (I-V) relationship. For example, the I-V relationship can have an exponential or a power-law relationship.

It will be appreciated that while FIG. 4C depicts a single localized conduction path 72 having a particular shape, representation is for illustrative purposes only and actual configurations can be different. For example, in some embodiments, the as-SET RRAM cell stack 50b of FIG. 4C can have multiple localized conduction paths 72. In addition, the shape can take any arbitrary form. Alternatively, the conduction path may be non-localized and extend over the entire cell area.

FIG. 4D illustrates a cross-sectional view of an as-RESET RRAM cell stack 50c of the RRAM cell of FIG. 4A, according to some embodiments. That is, the as-RESET RRAM cells stack 50c can represent a previously formed or SET RRAM cell stack 50b of FIG. 4C, after having received the pulse $V_{RESET}$ 68. Similar to FIG. 4C, the as-RESET RRAM cell stack 50c comprises a first electrode 16, a second electrode 14, and a resistive switching stack 100 comprising a resistive switching material 18c comprising an oxide of a pnictogen element formed by atomic layer deposition (ALD) and a metallic material 60 comprising the pnictogen element formed by ALD, wherein the resistive switching stack 100 is interposed between first electrode 16 and the metallic material 60. In addition, the as-RESET RRAM cell stack 50b can include a localized conduction path 74 within the resistive switching material 18c that may develop within a relatively homogeneous resistive switching material 18b of FIG. 4C under the biased pulse $V_{RESET}$ 68. Under biased pulses $V_{RESET}$ 68, the localized conduction path 72 of a previously SET RRAM cell stack 50b of FIG. 4C can become a localized conduction path 74 that is different from the localized conduction path 72 of FIG. 4C. It will be appreciated that the localized conduction path 74 different from the localized conduction path 72 of FIG. 4C can develop for a number of reasons. For example, the localized conduction path 72 can become discontinuous due to formation of a gap region 76 as illustrated in FIG. 4D. In addition, the localized conduction path 74 itself can become less conductive compared the localized conduction path 72 of FIG. 4C.

In some embodiments, similar to the localized conduction path 72 of FIG. 4C, the localized conduction path 74 can have a localized stoichiometry substantially different from the bulk resistive switching material 18c. For example, the stoichiometry of the localized conduction path 74 can be represented by $MO_z$, where z is substantially less than x of the bulk resistive switching material 18c represented by $MO_x$, for example by greater than 10%.

In addition, the localized conduction path 74 of FIG. 4D can also be substantially modified with respect to the localized conduction path 72 of FIG. 4C with respect to the composition, the shape, and the dimensions.

Without being bound to any theory, formation of the gap region 76 can be associated with movements of metallic atoms or ions, movements of oxygen atoms or ions, movement of oxygen vacancies, or any combination thereof, into and/or out of the gap region 76. In addition, the stoichiometry of gap region 76 can be between that of the bulk resistive switching material 18c and that of the localized conduction path 74.

In some embodiments, similar to the as-SET RRAM cell stack 50b of FIG. 4C, the as-RESET RRAM cell stack 50c of FIG. 4D can also be characterized electrically by a relatively localized conduction through the localized conduction path 74 and through the gap region 76. For example, as-RESET RRAM cell stack 50c having different areas can display a relatively constant current under a moderate read bias smaller than switching biases.

In some embodiments, the as-RESET RRAM cell stack 50c of FIG. 4D can be characterized electrically by a relatively non-linear current-voltage (I-V) relationship. In some embodiments, the degree of non-linearity of the as-RESET RRAM cell stack 50c can be substantially higher compared to the as-SET RRAM stack 50b of FIG. 4C.

It will be appreciated that while FIG. 4D depicts a single localized conduction path 74 having a particular shape, representation is for illustrative purposes only and actual configurations can be different. For example, in some embodiments, the as-RESET RRAM cell stack 50c of FIG. 4D can have multiple localized conduction paths 74. In addition, the shape can take any arbitrary form. Alternatively, the conduction path may be non-localized and extending over an entire area of the cell.

Referring back to FIG. 4A, still other embodiments are possible, such as, for example, embodiments having a metallic material 60 which comprises a mixture or an alloy of a pnictogen and a metal different from the pnictogen. In some of these embodiments, the RRAM cell stack 50 of FIG. 4A comprises a first electrode 16, a second electrode 14, and a resistive switching stack 100 interposed between the first electrode 16 the second electrode 14. The resistive switching stack 100 in turn comprises a resistive switching material 18 comprising an oxide, which may be formed by atomic layer deposition (ALD), e.g., thermal ALD, and a metallic material 60 comprising a pnictogen chosen from a group consisting of As, Bi, Sb and P, and a metal different from the pnictogen. The metallic material 60 can be formed by ALD, e.g., thermal ALD. The metallic material 60 is interposed between the resistive switching material 18 and first electrode 16 in the illustrated embodiment. It will be appreciated, however, that in other embodiments, the metallic material 60 can be interposed between the resistive switching material 18 and second electrode 14.

In some embodiments, the resistive switching material 18 comprises a metal oxide chosen from the group consisting of silicon oxide, hafnium oxide, aluminum oxide, zirconium oxide, tantalum oxide, titanium oxide, an oxide of a pnitogen, or mixtures or combinations thereof. In some embodiments, the metal oxide comprises the pnictogen or the metal element included in the metallic layer 60. In some other embodiments, the metal oxide comprises metal elements that are not included in the metallic layer 60. In some embodiments, the resistive switching material 18 includes a pnictogen oxide, e.g., $Sb_2O_3$ or $Sb_2O_5$ that is deposited by using any of the methods described above. In some other embodiments, the resistive switching material 18 includes $HfO_2$ and is deposited by thermal ALD, e.g., using $HfCl_4$ and $H_2O$ as precursors. In some other embodiments, the resistive switching material 18 including $HfO_2$ is deposited by thermal ALD by using TEMAHf or derivatives thereof as precursors of Hf with ozone and/or $H_2O$ as oxygen precursors. In some embodiments, the resistive switching material 18 includes $Al_2O_3$ and is deposited by thermal ALD using, e.g., TMA and $H_2O$ as precursors. In other embodiments, the resistive switching material 18 includes $ZrO_2$ and is deposited by thermal ALD using, e.g., $ZrCl_4$ and $H_2O$ as precursors. In yet other embodiments, the resistive switching material 18 including $ZrO_2$ is deposited by thermal ALD by using, e.g., TEMAZr or derivatives thereof as precursors of Zr with ozone and/or $H_2O$ as oxygen precursors.

In some embodiments having a metallic material 60 comprising a pnictogen and a metal different from the pnictogen, the metallic material 60 can be expressed as $M_xN_y$, which can be an alloy, a mixture, or a combination of materials, where M represents the pnictogen chosen from the group consisting of As, Bi, Sb and P, and x represents a relative fraction of the pnictogen in the material (e.g., $0<x<1$ where $x+y=1$). N represents the metal, where the metal is chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te, and y represents a relative fraction of the metal in the material (e.g., $0<y<1$ where $x+y=1$). In some other embodiments the metallic material 60 can have any suitable number of additional metals such that the metallic material 60 has a pnictogen, a metal, and second through nth metals, wherein the metal and second through nth metals are different metals chosen from the consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te. In particular embodiments, the metallic material 60 comprises one of alloys $Sb_xHf_y$ or $Sb_xAl_y$. Without being limited by theory, it is believed that combining a pnictogen, such as Sb, with the metal can increase the thermal stability of the metallic material 60, which can improve the manufacturing yield and long term reliability of resistive memories using that metallic material.

Still referring to FIG. 4A, in some embodiments having a metallic material 60 comprising a pnictogen and a metal different from the pnictogen, the RRAM cell stack 50 can be fabricated using a method which includes providing a substrate and providing a bottom electrode (the second electrode 14 in FIG. 4A) on the substrate. The method additionally includes forming via atomic layer deposition the resistive switching material 18 over, e.g., on, the bottom electrode 14, wherein the resistive switching material 18 comprises an oxide. The method additionally includes depositing via atomic layer deposition the metallic layer 60 on the resistive switching material 18, wherein the metallic layer 60 comprises the pnictogen and the metal. The method further includes forming the top electrode (the first electrode 16 in FIG. 4A) on the metallic layer 60 such that the metallic layer 60 contacts and is interposed between the resistive switching material 18 and the top electrode 16. As described above, one or both of the resistive switching material 18 and the metallic layer 60 can be deposited using thermal ALD. Deposition parameters such as temperature and exposure conditions for similar materials can be similar to those described above.

In some embodiments, depositing the metallic 60 layer comprises exposing the substrate to a pnictogen-containing precursor chosen from the group consisting of pnictogen halides, pnictogen alkoxides, pnictogen alkylamides, pnictogen alkylamines and pnictogen alkylsilyls, and further exposing the substrate to a metal-containing reactant. For example, depositing the metallic layer comprises exposing the substrate having the bottom electrode formed thereon (second electrode 14 in FIG. 4A) to one or more of pnictogen-containing reactants chosen from the group consisting of Sb halides, Sb alkoxides, Sb alkylamides, Sb alkylamines and Sb alkylsilyls, and further exposing the substrate to one or more of metal-containing reactants chosen from the group consisting of halides of the metal, alkoxides of the metal, alkylamides of the metal, alkylamines of the metal and alkylsilyls of the metal. In some embodiments, exposing the substrate to a pnictogen-containing precursor is followed by, e.g., immediately followed by, exposing the substrate to a metal-containing precursor. In some other embodiments, exposing the substrate to a pnictogen-containing precursor precedes, e.g., immediately precedes, exposing the substrate to a metal-containing precursor. In some embodiments, exposing the substrate to a pnictogen-containing precursor is followed by, e.g., immediately followed by, exposing the substrate to an oxygen-containing precursor. In some other embodiments, exposing the substrate to a metal-containing precursor is followed by, e.g., immediately followed by, exposing the substrate to an oxygen-containing precursor. By "immediately" followed by or precedes, it is meant that the referenced precursor is the very next or very last precursor, respectively, to which the substrate is exposed.

In some embodiments, forming the resistive switching material 18 can be advantageously performed at a matched temperature at which the metallic layer 60 is formed, such that the resistive switching material 18 is be formed in-situ (e.g., in the same process chamber) without having to substantially increase or decrease the substrate temperature between forming the resistive switching material 18 and depositing the metallic layer 60. In some embodiments, the matched temperature is between about 100° C. and about 400° C., between about 150° C. and about 350° C., or between about 200° C. and about 300° C.

In some embodiments, more than one metallic layer 60 and/or more than one resistive switching material 18 may be formed within the resistive switching stack 100, e.g., to form a nanolaminate resistive switching material. In some embodiments, one or more metallic layer 60 can be interposed by resistive switching material 18 and can serve as dopants to the resistive switching material 18. In some embodiments, the resistive switching stack 100 comprises a nanolaminate comprising alternating metallic layers 60 and resistive switching materials 18.

In embodiments where there is more than one metallic layer 60, the metallic layers 60 can have a thickness between about 5 nm and about 0.2 nm, between about 3 nm and about 0.3 nm, or between about 1 nm and about 0.5 nm. In embodiments where there is more than one resistive switching material 18, the resistive switching material 18 can have thicknesses between about 20 nm and about 0.2 nm, between about 10 nm and about 0.3 nm, or between about 5 nm and about 0.5 nm.

In some embodiments, the resistive switching stack 100 comprises a nanolaminate comprising alternating metallic layers 60 and resistive switching materials 18, wherein the metallic layers 60 and/or the resistive switching materials 18 have thicknesses that vary across a thickness of the resistive switching stack 100, such that the resistive switching stack 100 has an as-deposited gradient in metal concentration across the thickness of the resistive switching stack 100. In some embodiments, the thicknesses of one of the metallic layers 60 or the resistive switching materials 18 are varied across the thickness of the resistive switching stack 100, while in some other embodiments, the thicknesses of both of the metallic layers 60 and the resistive switching material 18 are varied across the thickness of the resistive switching stack 100. In some embodiments, the gradient in the concentration of the metal exists cross the thickness of the resistive switching stack 100 such that a difference between a highest and a lowest value of the concentration profile can exceed 1%, 5%, or 10%.

Referring back again to FIG. 4A, still other embodiments are possible. For example, in some embodiments, the resistive switching material 18 is formed at least in part by oxidation of the metallic material 60. In some of these embodiments, similar to some embodiments described above, the RRAM cell stack 50 of FIG. 4A comprises a first electrode 16, a second electrode 14, and a resistive switching stack 100 interposed between the first electrode 16 the second electrode 14. The resistive switching stack 100 in turn comprises a resistive switching material 18 and a metallic material 60 comprising a pnictogen chosen from a group consisting of As, Bi, Sb and P. Also similar to some embodiments described above, the metallic material 60 can additionally comprise a metal different than the pnictogen, for example, a metal is chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te. The metallic material 60 can be interposed between the resistive switching material 18 and first electrode 16 as in the illustrated embodiment, or be interposed between the resistive switching material 18 and second electrode 14.

Still referring to FIG. 4A, according to some embodiments where the resistive switching material 18 is formed at least in part by oxidation of metallic material 60, the RRAM cell stack 50 can be fabricated using a method which includes providing a substrate and providing the first electrode 16 on the substrate. The method additionally includes forming via atomic layer deposition the metallic layer 60 over, e.g., on, the first electrode 16, wherein the metallic layer 60 comprises a pnictogen chosen from the group consisting of As, Bi, Sb, and P. Forming the metallic layer 60 via atomic layer deposition can further comprise depositing the metal different than the pnictogen, similar to some embodiments described above. One or both of the pnictogen and/or the other metal different than the pnictogen can be deposited using thermal ALD. The method additionally includes forming the resistive switching material 18 by oxidizing at least a part of the metallic layer 60, such that the resistive switching material 18 comprises an oxide comprising the pnitogen and may, in some embodiments, further include the metal different than the pnictogen. In some embodiments, the ratios of exposures to a pnictogen precursor and an oxygen precursor may change over time, such that a layer 60 that is predominantly pnictogen and/or pnictogen and metal gradually changes into a layer 18 that is a stoichiometric pnictogen oxide with equal exposures of the substrate to a pnictogen-containing precursor and an oxygen-containing precursor. The method further includes forming the second electrode 14 over, e.g., on, the resistive switching material 18. Deposition parameters such as temperature can be similar to those described above for similar materials.

In some embodiments, depositing the metallic 60 layer comprises exposing the substrate to a pnictogen-containing precursor chosen from the group consisting of pnictogen halides, pnictogen alkoxides, pnictogen alkylamides, pnictogen alkylamines and pnictogen alkylsilyls, and further exposing the substrate to a metal-containing reactant. For example, depositing the metallic layer 60 comprises exposing the substrate having the first electrode 16 formed thereon to one or more of pnictogen-containing reactants chosen from the group consisting of Sb halides, Sb alkoxides, Sb alkylamides, Sb alkylamines and Sb alkylsilyls. Depositing the metallic layer 60 can further include exposing the substrate to one or more of metal-containing reactants chosen from the group consisting of halides of the metal, alkoxides of the metal, alkylamides of the metal, alkylamines of the metal and alkylsilyls of the metal. In some embodiments, exposing the substrate to a pnictogen-containing precursor is followed by, e.g., immediately followed by, exposing the substrate to a metal-containing precursor. In other embodiments, exposing the substrate to a pnictogen-containing precursor precedes, e.g., immediately precedes, exposing the substrate to a metal-containing precursor.

In some embodiments where the resistive switching material 18 is formed at least in part by oxidizing the metallic material 60, the resistive switching material 18 is formed by exposing the metallic layer 60 to an oxidizing reactant. Examples of the oxidizing reactant include, for example, ozone ($O_3$), molecular oxygen ($O_2$), oxygen radicals, water ($H_2O$) or a combination thereof. Advantageously, in some embodiments, the metallic layer 60 can be exposed to an oxidizing reactant at a temperature that is matched to the temperature at which the metallic layer 60 is formed, such that the resistive switching material 18 can be formed by oxidizing the metallic layer 60 in-situ (e.g., in the same processing chamber) and without having to substantially increase or decrease the temperature prior to oxidizing the metallic layer 60. In some embodiments, the oxidation is performed at a temperature between about 100° C. and about 400° C., between about 150° C. and about 350° C., or between about 200° C. and about 300° C.

In some embodiments, by repeating forming metallic layers and oxidizing the metallic layers, more than one metallic layer 60 and/or more than one resistive switching material 18 may formed within the resistive switching stack 100. In some embodiments, the resistive switching stack 100 comprises a nanolaminate comprising alternating metallic layers 60 and resistive switching materials 18 formed by oxidizing the metallic layers 60. The individual thicknesses of the metallic layers 60 and the individual thicknesses of the resistive switching materials 18 can be controlled by, for example, controlling the number and/or the duration of exposure to pnictogen-containing precursors relative to the number and/or duration of exposure to the oxidizing reactant.

In embodiments where there is more than one metallic layer 60, the metallic layers 60 may have a thickness between about 5 nm and about 0.2 nm, between about 3 nm and about 0.3 nm, or between about 1 nm and about 0.5 nm. In embodiments where there is more than one resistive switching material 18, the resistive switching material 18 can have thicknesses between about 20 nm and about 0.2 nm, between about 10 nm and about 0.3 nm, or between about 5 nm and about 0.5 nm.

In some embodiments, the resistive switching stack 100 comprises a nanolaminate comprising alternating metallic layers 60 and resistive switching materials 18, wherein the metallic layers 60 and/or the resistive switching materials 18 can have thicknesses that vary across a thickness of the resistive switching stack 100, such that the resistive switching stack 100 has an as-deposited gradient in metal concentration across the thickness of the resistive switching stack 100. The gradient in the concentration of the metal exists cross the thickness of the resistive switching stack 100 such that a difference between a highest and a lowest value of a concentration profile can exist, wherein the difference can exceed 1%, 5%, or 10%.

In some embodiments where more than one metallic layer 60 and/or more than one resistive switching material 18 are formed within the resistive switching stack 100, one or more metallic layers 60 can comprise a dopant layer interposed by, and serve as a source of dopant atoms to, a pair of adjacent resistive switching materials 18. In some embodiments, the dopant layer can comprise a pnictogen, e.g., the pnictogen of the resistive switching material 18. In some other embodiments, the dopant layer can comprise a second pnictogen other than the pnictogen of the resistive switching material 18. In some other embodiments, the dopant layer can comprise a metal chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te. In yet some other embodiments, the dopant layer can comprise any combination of the pnictogen, the second pnictogen and the metal.

In some embodiments, the resistive switching material 18 may be formed of an oxide material that does not contain a pnictogen (that is, a non-pnictogen oxide), as discussed herein. Such a resistive switching material 18 may be doped with a pnictogen and a metal, such as a metal chosen from the group consisting of Sc, Y, La, Ti, Zr, Hf, V, Nb, Ta, Cr, Mo, W, Co, Ni, Cu, Ag, Au, Zn, Cd, Hg, Al, Ga, In, Si, Ge, Sn, Pb, Se and Te. It will be appreciated that the resistive switching material 18 may be formed by ALD and that the dopants may be introduced during and/or between ALD cycles for forming the resistive switching material 18. For example, a substrate containing the resistive switching material 18 may be exposed to a pnictogen dopant precursor and to a metal dopant precursor once per plurality of non-pnictogen oxide ALD cycles. The pnictogen dopant precursor and a metal dopant precursor may include precursors suitable for ALD deposition, as discussed herein. In some embodiments, the pnictogen-containing precursor is one of a halide or alkylilyl compound, and the metal-containing reactant is the other of a halide or alkylsilyl compound, so that the combination of a halide precursor and an alkylsilyl precursor is provided.

Figure 5A:
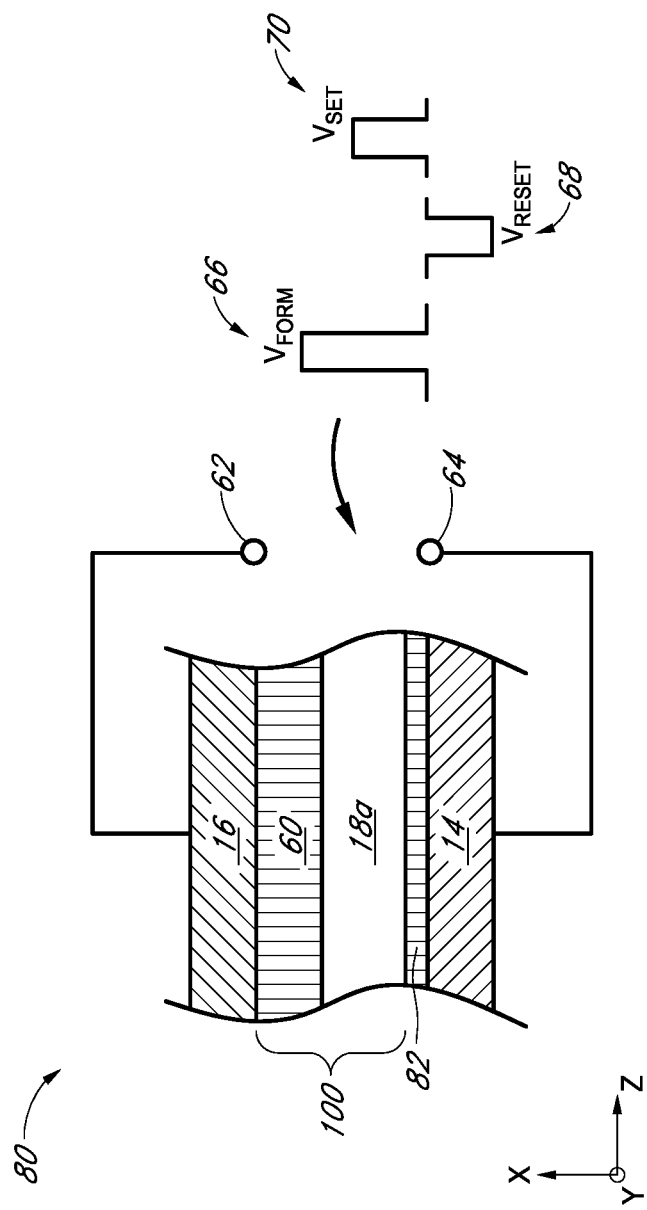
FIG. 5A is a schematic cross-sectional illustration of an RRAM cell stack according to some embodiments.

Referring to FIG. 5A, details, according to some embodiments, of the material stacks that comprise RRAM cells of FIGS. 1 and 2 are disclosed herein. An RRAM cell stack 80 of FIG. 5A can represent a cross-section taken of an RRAM cell along sections 5 in FIGS. 1 and 2. Similar to the RRAM cell stack 50 of FIG. 4A, the RRAM cell stack 80 comprises a first electrode 16, a second electrode 14, and a resistive switching stack 100 comprising a resistive switching material 18a comprising an oxide of a pnictogen element formed by atomic layer deposition (ALD) and a metallic material 60 comprising the pnictogen element formed by ALD, wherein the resistive switching stack 100 is interposed between first second electrodes 16 and 14, and the resistive switching material 18a is interposed between the first electrode 16 and the metallic material 60. The structures and methods of materials and layers within the RRAM cell stack 80 that are similar to the structures and methods of materials and layers within the RRAM cell stack 50 discussed above in connection with FIG. 4A.

In addition, the RRAM cell stack 80 of FIG. 5A further includes a barrier layer 82 interposed between the second electrode 14 and the metallic material 60. As discussed more below in connection with FIGS. 5B-5D, the barrier layer can function to limit the current through the RRAM cell during programming. In some embodiments with the resistive switching material 18a disposed between the second electrode 14 and the metallic layer 60, the barrier layer 82 is interposed between the second electrode 14 and the resistive switching material 18a.

In some implementations, as discussed below in connection with FIGS. 5B-5D, the barrier layer 82 can improve the degree of nonlinearity of the current-voltage relationship of the RRAM cell stack 80 under both LRS and HRS states. The barrier layer 82 can include a suitable dielectric material including metal oxides and nitrides, such as, e.g., $HfO_2$, $ZrO_2$, $Cu_2O$, $TaO_2$, $Ta_2O_5$, $TiO_2$, $SiO_2$, $Al_2O_3$, $Si_3N_4$, MN, and SiON, among others, and mixtures thereof.

Several factors can be considered for choosing the material and dimensions for the barrier layer 82. One factor can be an electronic barrier offset between the conduction band of the barrier layer 82 and at least one of the metallic material 60, the second electrode 14, and the first electrode 16. In general, a higher barrier offset between an electron-injecting electrode and the dielectric conduction band results in lower tunneling currents during programming, which can lead to reduced current during programming. In some embodiments, the barrier offset between the conduction band of the barrier layer 82 and the at least one of the metallic material 60, the second electrode 14, and the first electrode 16 is between about 1.5 eV and about 4 eV, for instance about 2.5 eV.

In general, a thicker barrier can also result in lower tunneling currents during programming. On the other hand, a thicker barrier may increase the degree of nonlinearity. In some embodiments, the thickness of the barrier layer 82 is between about 1 nm and 10 nm, for instance about 2 nm.

In addition, as discussed in connection with FIGS. 1 and 2, the barrier layer 82 may be formed using thermal atomic layer deposition (ALD) according to some embodiments, which can be particularly advantageous for forming 3D RRAM memory cells.

In some embodiments, the barrier layer 82 includes $HfO_2$ and is deposited by thermal ALD using $HfCl_4$ and $H_2O$ as precursors. In some other embodiments, the barrier layer 82 including $HfO_2$ is deposited by thermal ALD by using TEMAHf or derivatives thereof as precursors of Hf with ozone and/or $H_2O$ as oxygen precursors. In some embodiments, the barrier layer 82 includes $Al_2O_3$ and is deposited by thermal ALD using TMA and $H_2O$ as precursors. In other embodiments, the barrier layer 82 includes $ZrO_2$ and is deposited by thermal ALD using $ZrCl_4$ and $H_2O$ as precursors. In yet other embodiments, the barrier layer 82 including $ZrO_2$ is deposited by thermal ALD by using TEMAZr or derivatives thereof as precursors of Zr with ozone and/or $H_2O$ as oxygen precursors.

Figure 5B:
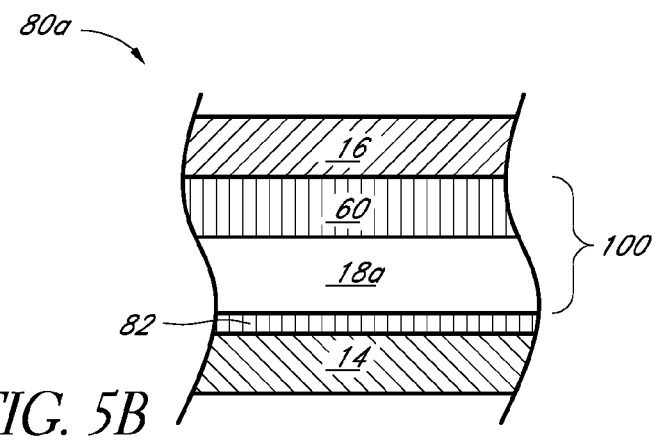
FIGS. 5B-5D are schematic cross-sectional illustrations of the RRAM cell stack of FIG. 5A at various stages of operation, according to some embodiments.
Figure 5C:
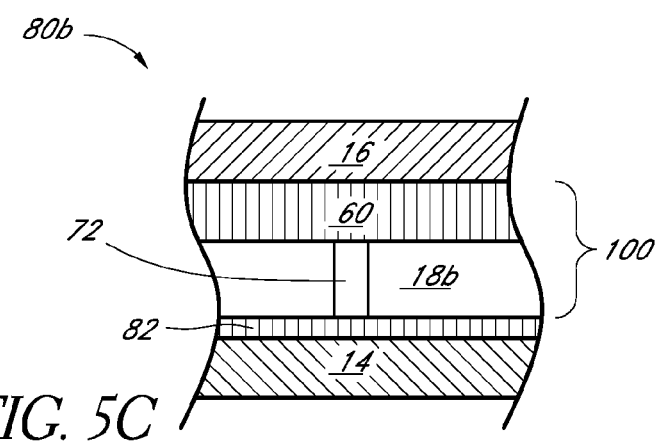
Figure 5D:
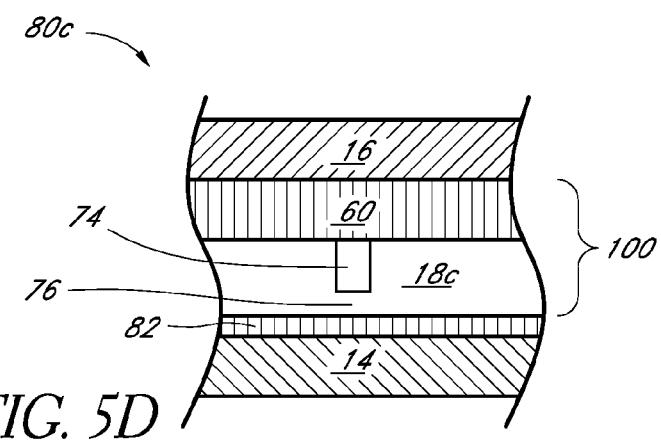

In FIGS. 5B to 5D physical changes to the resistive stack 100 during operation is described, according to some embodiments. FIG. 5B illustrates a cross-sectional view of an unformed RRAM cell stack 80a similar to the unformed RRAM cell stack 50a of FIG. 4B, according to some embodiments. Unlike FIG. 4B, the unformed RRAM cell stack 80a of FIG. 5B additionally includes a barrier layer 82 interposed between the resistive switching material 18a and the second electrode 14.

Similar to FIG. 4B, the unformed RRAM cell stack 80a of FIG. 5B can be characterized by relatively homogeneous resistive switching material 18a without substantially localized conduction paths.

FIG. 5C illustrates a cross-sectional view of an as-formed or as-SET RRAM cell stack 80b, according to some embodiments. Similar to FIG. 4C, the as-formed or as-SET RRAM cells stack 80b can represent the RRAM cell stack 50a after receiving pulses $V_{FORM}$ 66 and $V_{SET}$ 70 as illustrated in FIG. 5A. Also similar to FIG. 4B, the as-formed or as-SET RRAM cell stack 80b can include a localized conduction path 72 within the resistive switching material 18b. The formation process and the physical characteristics of the localized conduction path 72 can be substantially similar to the localized conduction path 72 discussed above in connection with FIG. 4C. Unlike FIG. 4C, however, the localized conduction path 72 of FIG. 5C can be interrupted or prevented from extending into the barrier layer 82.

Without being bound to any theory, the barrier layer 82 can interrupt and even prevent the formation of the conductive path 72 within the barrier layer 82 by retarding or preventing movement of metal atoms or ions, oxygen atoms or ions, oxygen vacancies, or any combination thereof within the barrier layer 82 overlapping the conductive path 72. One indication that the retardation or prevention of movement of the atoms and/or ions can be the relative melting temperatures of the barrier layer 82 and the resistive switching material 18, which can be an indirect indicator of the relative thermodynamic stability, as can be measured, for example, by Gibbs free energy of formation. For example, a resistive switching material according to some embodiments, $Sb_2O_5$, has a relatively low melting temperature of about 525° C. As an illustrative comparison, $HfO_2$ has a relatively high melting temperature of greater than 2700° C. In some embodiments, the melting temperature of the barrier layer 82 is higher than the melting temperature of the resistive switching material 18 by about 1× to about 3×, for instance about 2×. In some embodiments, the melting temperature of the barrier layer 82 is higher than the melting temperature of the resistive switching material 18 by about 3× to about 5×, for instance about 4×.

Similar to FIG. 4C, the as-SET RRAM cell stack 80b of FIG. 5C can be characterized electrically by a relatively localized conduction through the localized conduction region 72. Unlike FIG. 4B, however, the as-formed or as-SET RRAM cell stack 80b of FIG. 5B can be characterized electrically by a non-Ohmic conduction having a relatively higher degree of non-linearity in the current-voltage (I-V) relationship compared to the as-formed or as-SET RRAM cell stack 50b of FIG. 4C.

Similar to FIG. 4C, it will be appreciated that while FIG. 5C depicts a single localized conduction path 72 having a particular shape, however this representation is schematic and for illustrative purposes only and actual configurations can be different. For example, in some embodiments, the as-SET RRAM cell stack 80b of FIG. 5C can have multiple localized conduction paths 72. In addition, the shape can take any arbitrary form.

FIG. 5D illustrates a cross-sectional view of an as-RESET RRAM cell stack 80c of the RRAM cell of FIG. 5A, according to some embodiments. That is, the as-RESET RRAM cells stack 80c can represent a previously formed or SET RRAM cell stack 80b of FIG. 5C, after having received the pulse $V_{RESET}$ 68. The layers and materials included in the as-RESET RRAM cell stack 50c of FIG. 4D are similarly included in the as-RESET RRAM cell stack 80c of FIG. 5D. In addition, the as-RESET RRAM cell stack 80c of FIG. 5D also includes the barrier layer 82 interposed between the localized conduction path 72 and the second electrode 14. The formation process and the physical characteristics of the localized conduction path 72 and the gap region 76 can be substantially similar to the localized conduction path 72 and the gap region 76 discussed above in connection with FIG. 4D. For example, the gap region 76 is disposed between the conductive path 74 and the second electrode 14. Unlike FIG. 4D, however, the localized conduction path 72 of FIG. 5C can be further interposed by the barrier layer 82.

Also similar to FIG. 4D, the as-RESET RRAM cell stack 80c of FIG. 5D can also be characterized electrically by a relatively localized conduction through the localized conduction path 74 and through the gap region 76. Unlike FIG. 4D, however, because electrons also traverse the barrier layer 82, in some embodiments, the as-RESET RRAM cell stack 80c of FIG. 5D can be characterized electrically by a higher degree of non-linearity as compared to the as-RESET RRAM cell stack 50c of FIG. 4D, for example by about 10×. In some embodiments, for example, the degree of nonlinearity (defined as the ratio of current at VSET START/current at 0.5 VSET START) for an as-RESET RRAM stack 80c of FIG. 5D can be between about 100 and about 10,000, or between about 10 and about 10,000, for instance about 2,000.

Also similar to FIG. 4D, FIG. 5D depicts a single localized conduction path 74 having a particular shape, this schematic representation is for illustrative purposes only and actual configurations can be different. For example, in some embodiments, the as-RESET RRAM cell stack 80c of FIG. 5D can have multiple localized conduction paths 74. In addition, the shape can take any arbitrary form. Alternatively, the conduction path may be non-localized and extending over an entire area of the cell.

Figure 6:
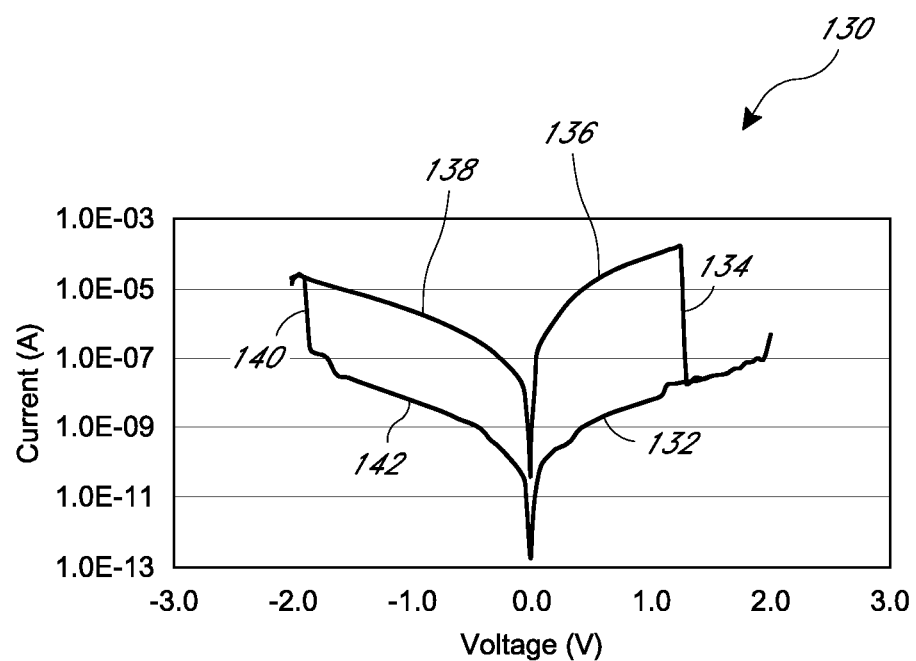
FIG. 6 is an illustration of the measured current-voltage relationship for an RRAM cell according to some embodiments.
Figure 7:
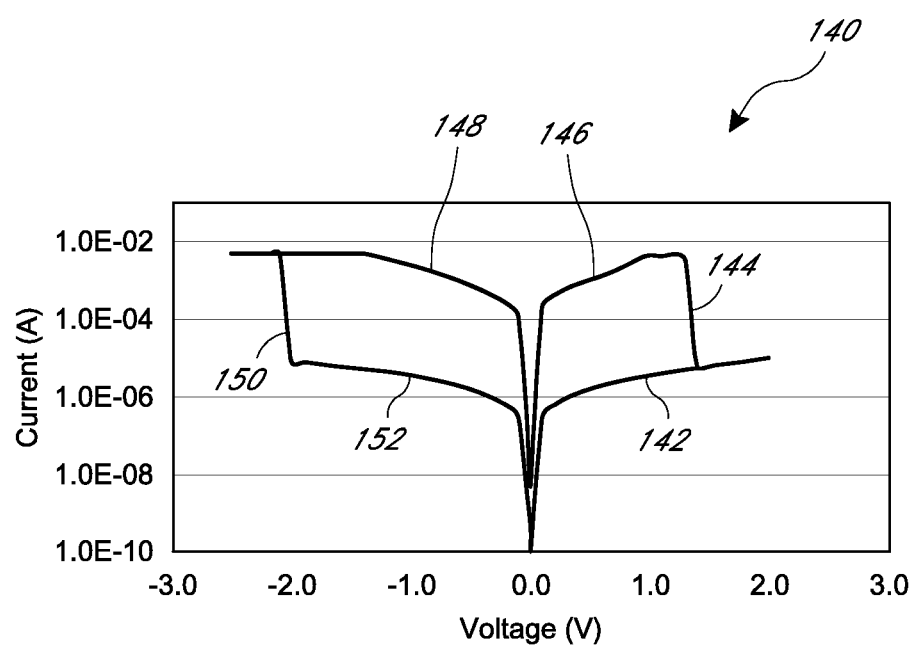
FIG. 7 is an illustration of the measured current-voltage relationship for an RRAM cell according to some other embodiments.

FIGS. 6 and 7 illustrate experimental I-V curves of RRAM cells comprising an oxide of a pnictogen element and a metallic layer comprising the pnictogen element formed by atomic layer deposition, and further comprising a barrier layer.

The I-V curve 130 of FIG. 6 corresponds to an RRAM cell including a TiN second electrode, 10 nm $HfO_2$ barrier layer on the TiN second electrode, 10 nm $Sb_2O_5$ resistive switching material on the $HfO_2$ barrier layer, a 10 nm Sb metallic material on the resistive switching material. The I-V curve was measured under a compliance current of $1 \times 10^{-4}$ A during the SET operation, which can limit the steady state current passing though the RRAM cell.

A SET portion of the I-V curve 130 of FIG. 6 includes a SET HRS I-V portion 142 ranging in the voltage axis from an a $V_{INIT}$ of about zero to $V_{SET\ START}$ of about −1.9V, a SET HRS-to-LRS transition I-V portion 140, and a SET return I-V portion 138 from $V_{SET\ END}$ of about −1.9V to $V_{INIT}$ of about zero.

A RESET portion of the I-V curve 130 of FIG. 6 includes a RESET LRS I-V portion 136 ranging in the voltage axis from an a $V_{INIT}$ of about zero to $V_{RESET\ START}$ of about 1.3V, a RESET LRS-to-HRS transition I-V portion 134, and a RESET return I-V portion 132 from $V_{RESET\ END}$ of about 1.3V to $V_{INIT}$ of about zero.

The I-V curves of FIG. 6 illustrates an ON/OFF current ratio of about 400 between the LRS and HRS states measured at −300 mV. In addition, a degree of nonlinearity of about 10 can be observed in both LRS and HRS states, which can indicate the presence of a conductive path region that does not extend completely between the second electrode and the metallic material.

The I-V curve 140 of FIG. 7 corresponds to an RRAM cell including the same stack of materials as the RRAM cell in FIG. 6. In contrast to FIG. 6, however, the I-V curve was measured under a higher compliance current of $5 \times 10^{-3}$ A during the SET operation.

A SET portion of the I-V curve 140 of FIG. 7 includes a SET HRS I-V portion 152 ranging in the voltage axis from an a $V_{INIT}$ of about zero to $V_{SET\ START}$ of about −2.0V, a SET HRS-to-LRS transition I-V portion 150, and a SET return I-V portion 148 from $V_{SET\ END}$ of about −2.0V to $V_{INIT}$ of about zero.

A RESET portion of the I-V curve 140 of FIG. 7 includes a RESET LRS I-V portion 146 ranging in the voltage axis from an a $V_{INIT}$ of about zero to $V_{RESET\ START}$ of about 1.4V, a RESET LRS-to-HRS transition I-V portion 144, and a RESET return I-V portion 142 from $V_{RESET\ END}$ of about 1.4V to $V_{INIT}$ of about zero.

As discussed, the nominal stacks of the RRAM cells of FIGS. 6 and 7 are the same but the two RRAM cells are measured under different compliance current conditions ($1 \times 10^{-4}$ A in FIG. 6 versus $5 \times 10^{-3}$ A in FIG. 7). As a result, while some electrical features of the I-V curves of the RRAM cells in FIGS. 6 and 7 are similar, other electrical features are distinguishable. For example, similar to FIG. 6, the I-V curves of FIG. 7 illustrates an ON/OFF current ratio between the LRS and HRS states measured at 300 mV of about 400. In contrast to FIG. 6, however, the degree of nonlinearity of about 2 (compared to about 10 in FIG. 6) can be observed in both LRS and HRS states, which can indicate an Ohmic conductive path region that extends completely between the second electrode and the metallic material (i.e., through both the 10 nm $Sb_2O_5$ as the resistive switching material the 10 nm $HfO_2$ as the barrier layer). One interpretation of the difference is that, while the lower compliance current used in measuring the RRAM cell of FIG. 6 allows for the $HfO_2$ barrier layer provide the nonlinearity of the I-Vs, substantially higher compliance current used in measuring the RRAM cell of FIG. 7 has led to a hard dielectric breakdown of the $HfO_2$ barrier layer, leading to a much lower degree of nonlinearity. FIGS. 6 and 7 indicate that, by appropriate selection of operating windows, the barrier layer can advantageously provide a high degree of non-linearity.

It will be appreciated that various modifications to the embodiments described herein are possible. For example, in some embodiments, the interface between the pnictogen element oxide (e.g., $SbO_x$) layer and the layer of the metallic pnictogen element (e.g., Sb) may not be abrupt but may be gradual. For example, by intermixing or alternating cycles of the oxide deposition process and the metal element deposition process, an interface region with a nano-laminate structure may be formed. The nanolaminate may include alternating layers of the pnictogen element oxide and the pnictogen element. A gradual, or graded, interface may be formed by gradually decreasing the pnictogen element oxide (e.g., $SbO_x$) content and increasing the pnictogen element (e.g., Sb) content throughout this nano-laminate structure, as the materials composition transitions from the pnictogen element oxide to the pnictogen element. Increasing the content of one material can be accomplished by increasing the number of deposition cycles of that material relative to the other material. For example, the ratio of pnictogen element deposition cycles compared to pnictogen element oxide deposition cycles may increase as the stack transitions from a pnictogen element oxide layer to a pnictogen element layer.

In some embodiments, RRAM cells comprising a nanolaminate structure do not require a forming step.

In some embodiments, the entire resistive switching stack may be formed by a nanolaminate structure of pnictogen element oxide (e.g., $SbO_x$) layers alternated by pnictogen element (e.g., Sb) layers so that a desired oxygen deficiency is created throughout the layer. In such embodiments, an additional, separate metallic pnictogen element layer (thicker than individual pnictogen element oxide layers) may be omitted. In some embodiments, the pnictogen element layers forming the nanolaminate may be thinner than the pnictogen element oxide layers.

In addition, it will be appreciated by those skilled in the art that various omissions, additions and modifications can be made to the processes described above without departing from the scope of the invention, and all such modifications and changes are intended to fall within the scope of the invention, as defined by the appended claims.

What is claimed is:

1. A method of forming a resistive random access memory device, comprising forming a resistive random access memory cell, wherein forming the resistive random access memory cell comprises:
   providing a first electrode;
   forming a resistive switching material comprising an oxygen and a pnictogen element by atomic layer deposition, wherein forming the resistive switching material by atomic layer deposition comprises alternatingly exposing a deposition surface to a pnictogen precursor and an oxygen precursor at different times; and
   forming a metallic layer comprising the pnictogen element by atomic layer deposition,
   wherein the resistive switching material is interposed between the first electrode and the metallic layer.

2. The method of claim 1, wherein forming the resistive switching material comprises depositing the resistive switching material by thermal atomic layer deposition.

3. The method of claim 1, wherein the pnictogen is Sb.

4. The method of claim 3, wherein the resistive switching material comprises $SbO_x$.

5. The method of claim 3, wherein depositing the metallic layer comprises using precursors comprising one of Sb halides, Sb alkoxides, Sb alkylamides and Sb alkylsilyls.

6. The method of claim 5, wherein depositing the metallic layer comprises using an Sb alkylsilyl as a first precursor in combination with a second precursor comprising one of Sb halides, Sb alkoxides and Sb alkylamides.

7. The method of claim 3, wherein forming the resistive switching material comprises using precursors comprising ozone and one of Sb halides, Sb alkoxides, and Sb alkylamides.

8. The method of claim 1, wherein the metallic layer is in physical contact with the resistive switching material.

9. The method of claim 1, further comprising:
providing a sacrificial layer over a substrate surface;
forming a hole extending vertically through the sacrificial layer;
forming a second electrode comprising filling the hole with a second electrode material;
removing the sacrificial layer to form a recess; and
forming the resistive switching material comprising lining the recess with a resistive switching material by depositing an oxide of a pnictogen element by atomic layer deposition.

10. A method of forming a resistive random access memory cell, comprising:
forming a first electrode;
forming a barrier layer comprising a metal oxide over the first electrode;
forming a resistive switching material over the barrier layer by atomic layer deposition,
wherein forming the resistive switching material by atomic layer deposition comprises exposing a deposition surface to a precursor comprising a pnictogen element;
forming a metallic layer over the resistive switching material by atomic layer deposition; and
wherein the barrier layer and the resistive switching material are interposed between the first electrode and the metallic layer.

11. The method of claim 10, wherein forming the barrier layer comprises forming the barrier layer interposed between the first electrode and the resistive switching material.

12. The method of claim 11, wherein the barrier layer comprises a metal oxide chosen from a group consisting of silicon oxide, hafnium oxide, aluminum oxide, zirconium oxide, tantalum oxide, titanium oxide.

13. The method of claim 12, wherein the resistive switching material comprises an oxide of the pnictogen element.

14. The method of claim 13, wherein forming the resistive switching material comprises depositing by thermal atomic layer deposition.

15. The method of claim 14, wherein the pnictogen element is Sb.

16. The method of claim 15, wherein the metallic layer comprises a pnictogen element.

17. The method of claim 16, wherein forming the metallic layer comprises depositing the metallic layer by thermal atomic layer deposition.

18. The method of claim 17, wherein the metallic layer comprises Sb.

19. The method of claim 18, wherein forming the barrier layer comprises depositing by thermal atomic layer deposition.

20. A resistive random access memory device comprising a memory cell, the memory cell comprising:
a first electrode comprising TiN;
metallic layer comprising a pnictogen element; and
a resistive switching material comprising an oxide of a pnictogen element,
wherein the resistive switching material is interposed between the first electrode and the metallic layer,
wherein the resistive random access memory device comprises a plurality of first electrodes formed at different vertical levels, and
wherein the device further comprises a second electrode including a vertically-extending conductive rod.

21. The resistive random access memory device of claim 20, wherein the first electrode is disposed over a surface of a substrate, the first electrode having a major surface substantially parallel to the surface of the substrate and a hole extending vertically therein, and wherein the resistive switching material lines sidewall surfaces of the hole.

22. The resistive random access memory device of claim 21, wherein the pnictogen element for the metallic layer is Sb.

23. The resistive random access memory device of claim 22, wherein the pnictogen element for the resistive switching material is Sb.

24. A method of forming a random access memory cell, comprising:
providing a first electrode;
forming by atomic layer deposition a resistive switching material comprising a nanolaminate layer comprising a plurality of alternating elemental pnictogen layers and pnictogen oxide layers; and
providing a second electrode,
wherein the resistive switching material is interposed between the first electrode and the second electrode.

25. The method of claim 24, wherein the pnictogen layers are Sb layers and pnictogen oxide layers are $SbO_x$ layers.

26. The method of claim 25, further comprising a barrier layer comprising a metal oxide interposed between the resistive switching material and the first electrode.

27. A method of fabricating a resistive random access memory cell, comprising:
providing a substrate;
providing a first electrode on the substrate;
forming via atomic layer deposition a resistive switching material over the first electrode, wherein the resistive switching material comprises an oxide; and
depositing via atomic layer deposition a metallic layer on the resistive switching material, wherein the metallic layer comprises:
a metal; and
a pnictogen chosen from the group consisting of As, Bi, Sb, and P,
wherein depositing via atomic layer deposition comprises exposing the substrate to a precursor comprising the pnictogen between exposures to a precursor comprising the metal.

28. The method of claim 27, further comprising forming a second electrode on the metallic layer such that the metallic layer contacts and is interposed between the resistive switching material and the second electrode.

29. The method of claim 27, wherein forming the resistive switching material comprises depositing the resistive switching material by thermal atomic layer deposition.

30. The method of claim 29, wherein a deposition temperature for the thermal atomic layer deposition is between about 100° C. and about 400° C.

31. The method of claim 27, further comprising forming a second resistive switching material on the metallic layer such that the metallic layer is interposed between the resistive switching material and the second resistive switching material.

32. The method of claim 27, wherein forming the metallic layer comprises depositing the metallic layer by thermal atomic layer deposition at a temperature less than about 250° C.

33. The method of claim 27, wherein forming the first electrode includes depositing a TiN layer.

34. The method of claim 33, wherein the resistive switching material is in physical contact with the first electrode after forming a resistive switching material.

35. The method of claim 34, wherein forming the first electrode comprises depositing the TiN layer at a temperature of about 400° C. or less.

36. The method of claim 33, wherein forming the first electrode comprises depositing the TiN layer by atomic layer deposition using precursors comprising $TiCl_4$ and $NH_3$.

37. The method of claim 27, further comprising forming a second electrode.

38. The method of claim 37, wherein forming the second electrode comprises depositing the second electrode such that the second electrode is in physical contact with the metallic layer.

39. The method of claim 37, wherein forming the second electrode comprises depositing a TiN layer at a temperature of about 400° C. or less.

40. The method of claim 27, wherein the metallic layer constitutes a second electrode.

41. The method of claim 27, wherein the memory cell does not include a noble metal.

42. The method of claim 27, wherein providing the first electrode comprises providing a plurality of vertically-spaced apart first electrode layers, further comprising:
    forming a hole extending vertically through the plurality of first electrode layers,
    wherein forming the resistive switching material comprises lining sidewalls of the hole with the resistive switching material by depositing the oxide of a pnictogen element by atomic layer deposition, and
    wherein forming the metallic layer comprises forming the metallic layer comprising the pnictogen directly adjacent the resistive switching material.

43. The method of claim 42, wherein the hole has an aspect ratio exceeding about 20:1.

44. The method of claim 42, wherein surfaces of the sidewalls comprise a heterogeneous composition.

45. The method of claim 44, wherein surfaces of the sidewall has alternating insulating regions and conductive regions through the first electrode layers.

46. The method of claim 27, wherein the resistive switching layer has a concentration of the pnictogen, the method further comprising forming a graded interface region interposed between the resistive switching material and the metallic layer, wherein the interface region has a concentration of the pnictogen between a concentration of the pnictogen of the metallic layer and the concentration of the pnictogen of the resistive switching layer.

47. The method of claim 46, wherein the interface region comprises a nanolaminate layer comprising alternating layers of the oxide of the pnictogen and layers of the pnictogen, wherein a concentration of the pnictogen in the interface region increases from a first side to a second side of the interface region.

48. A method of fabricating a resistive random access memory cell, comprising:
    providing a substrate;
    providing a first electrode on the substrate;
    forming via atomic layer deposition a resistive switching material over the first electrode, wherein the resistive switching material comprises a non-pnictogen oxide; and
    doping the oxide with a metallic material comprising:
        a metal; and
        a pnictogen chosen from the group consisting of As, Bi, Sb, and P.

49. A method of fabricating a resistive random access memory cell, comprising:
    providing a substrate;
    providing a first electrode on the substrate;
    depositing via atomic layer deposition a metallic layer over the first electrode, wherein the metallic layer comprises a pnictogen chosen from the group consisting of As, Bi, Sb, and P,
    wherein depositing via atomic layer deposition comprises exposing the substrate to a precursor comprising the pnictogen while depositing the metallic layer; and
    forming via oxidation of the metallic layer a resistive switching material over the first electrode.

50. The method of claim 49, further comprising forming a second electrode over the resistive switching material.

51. The method of claim 49, wherein depositing via atomic layer deposition comprises depositing the metallic layer by thermal atomic layer deposition.

52. The method of claim 49, wherein forming the resistive switching material comprises oxidizing using one of ozone or $H_2O$.

53. The method of claim 52, oxidizing using ozone comprises oxidizing at a temperature between about 100° C. and about 400° C.

54. The method of claim 49, further comprising forming a multi-layer resistive switching stack, comprising:
    depositing a second metallic layer on the resistive switching material via atomic layer deposition; and
    forming a second resistive switching material via oxidation of the second metallic layer.

55. The method of claim 54, wherein thicknesses of the metallic layers or the resistive switching materials are different from one another such that a concentration gradient in the pnictogen is created across a thickness of the multi-layer resistive switching stack.

56. The method of claim 55, wherein the resistive switching material and the second resistive switching material are a same material.

* * * * *

UNITED STATES PATENT AND TRADEMARK OFFICE
CERTIFICATE OF CORRECTION

| | | |
|---|---|---|
| PATENT NO. | : 9,520,562 B2 | Page 1 of 2 |
| APPLICATION NO. | : 14/334536 | |
| DATED | : December 13, 2016 | |
| INVENTOR(S) | : Qi Xie | |

It is certified that error appears in the above-identified patent and that said Letters Patent is hereby corrected as shown below:

On the Title Page

Page 1 (item (54), Title) at Line 2, After "MEMORY" insert --DEVICE--.

In the Specification

In Column 1 at Line 2, After "MEMORY" insert --DEVICE--.

In Column 8 at Line 15, Change "jr," to --Ir,--.

In Column 11 at Line 67, Change "gap," to --gap.--.

In Column 11 at Line 30, Delete "rod" after --line 14--.

In Column 15 at Line 46, Change "Sb(N$^1$Pr$_2$)$_3$." to --Sb(N$^i$Pr$_2$)$_3$.--.

In Column 17 at Line 45, After "etc" insert --.--.

In Column 23 at Lines 26-27, Change "pnitogen," to --pnictogen,--.

In Column 26 at Line 17 (approx.), Change "pnitogen" to --pnictogen--.

In Column 28 at Line 7 (approx.), Change "alkylilyl" to --alkylsilyl--.

In Column 28 at Line 47, Change "MN," to --AlN,--.

In Column 31 at Line 11, After "an" delete "a".

In Column 31 at Line 17, After "an" delete "a".

Signed and Sealed this
Twenty-fifth Day of April, 2017

Michelle K. Lee
*Director of the United States Patent and Trademark Office*

In Column 31 at Line 35, After "an" delete "a".

In Column 31 at Line 41, After "an" delete "a".